(12) United States Patent
Honda

(10) Patent No.: US 9,007,864 B2
(45) Date of Patent: Apr. 14, 2015

(54) INFORMATION PROCESSING APPARATUS, NONVOLATILE STORAGE DEVICE, INFORMATION PORCESSING SYSTEM AND NONVOLATILE MEMORY CONTROLLER

(75) Inventor: Toshiyuki Honda, Kyoto (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 937 days.

(21) Appl. No.: 13/037,683

(22) Filed: Mar. 1, 2011

(65) Prior Publication Data

US 2011/0231690 A1    Sep. 22, 2011

(30) Foreign Application Priority Data

Mar. 16, 2010    (JP) .................. 2010-059051

(51) Int. Cl.
*G11C 5/14* (2006.01)

(52) U.S. Cl.
CPC ...................... *G11C 5/147* (2013.01)

(58) Field of Classification Search
USPC ........... 365/226, 227, 189.09, 185.23, 230.06
See application file for complete search history.

(56) References Cited

U.S. PATENT DOCUMENTS

| | | | |
|---|---|---|---|
| 5,818,781 A | 10/1998 | Estakhri et al. | |
| 6,088,829 A * | 7/2000 | Umemura et al. | 714/798 |
| 7,317,632 B2 | 1/2008 | Chen et al. | |
| 7,596,048 B2 | 9/2009 | Kamiyama | |
| 8,321,697 B2 * | 11/2012 | Fujimoto | 713/300 |
| 2002/0120820 A1 * | 8/2002 | Higuchi et al. | 711/154 |
| 2005/0041509 A1 * | 2/2005 | Kumahara et al. | 365/226 |
| 2007/0109876 A1 * | 5/2007 | Umezawa | 365/189.09 |
| 2007/0133299 A1 | 6/2007 | Chen et al. | |
| 2008/0219078 A1 | 9/2008 | Kamiyama | |
| 2008/0266970 A1 * | 10/2008 | Lee et al. | 365/185.19 |

FOREIGN PATENT DOCUMENTS

| | | |
|---|---|---|
| JP | 56-123023 | 9/1981 |
| JP | 2000-500892 | 1/2000 |
| JP | 2007-164970 | 6/2007 |
| JP | 2008-217147 | 9/2008 |
| JP | 2009-199106 | 9/2009 |

OTHER PUBLICATIONS

"The MultiMediaCard System Secification", Vrsion 3.1, MMCA Technical Committee, Jun. 2001.*

* cited by examiner

*Primary Examiner* — Son Dinh
*Assistant Examiner* — Uyen B Tran
(74) *Attorney, Agent, or Firm* — Wenderoth, Lind & Ponack, L.L.P.

(57) ABSTRACT

A host device includes a voltage source which is connected to a voltage line via a host voltage switch and which supplies a first voltage to the voltage line, a host regulator which is connected to the voltage line and which outputs the first voltage or a second voltage that is lower than the first voltage, a host IO driver for driving a data line with the output of the host regulator as a power source, a host voltage detection circuit for detecting whether the voltage of the data line is the second voltage or a voltage that is higher than the second voltage, and a host control unit for detecting a mismatch of interface voltages between the host device and a memory card based on the output voltage of the host regulator and the detection result of the host voltage detection circuit.

9 Claims, 19 Drawing Sheets

INFORMATION PROCESSING APPARATUS, NONVOLATILE STORAGE DEVICE, INFORMATION PORCESSING SYSTEM AND NONVOLATILE MEMORY CONTROLLER

BACKGROUND OF THE INVENTION

1. Field of the Invention

The present invention relates to a nonvolatile storage device that uses a nonvolatile memory such as a flash memory, an information processing apparatus for controlling the nonvolatile storage device, an information processing system comprising the nonvolatile storage device and the information processing apparatus, and a nonvolatile memory controller for controlling the nonvolatile memory.

2. Description of the Related Art

In recent years, as a nonvolatile storage device equipped with a NAND-type flash memory as a rewritable nonvolatile memory, memory cards are being used as the storage medium of digital cameras and mobile phones, and its market is expanding.

Moreover, pursuant to the microfabrication of the semiconductor process, the bit unit price of nonvolatile storage devices has decreased and nonvolatile storage devices are being used as an inexpensive storage device in markets other than memory cards; for example, as memories of SSD (Solid State Drive) used as a substitute of HDD (Hard Disk Drive) or of embedded systems which are directly mounted on a host device, and its application is expanding.

Here, pursuant to the increase in the capacity of memory cards, the amount of data that is handled by digital cameras, mobile phones, digital video cameras and the like as the information processing apparatus for controlling the memory card is also increasing, and, as a legitimate requirement, faster data transfer performance between the memory card and the information processing apparatus and lower power consumption are being demanded.

As one solution of performing the transfer of data faster and with low power, there is a method of reducing the amplitude voltage of the interface signals. The interface voltage of a standard memory card was mainly 3.3 V, but the application of a low interface voltage of 1.8 V has begun.

Meanwhile, contrary to the trend of lowering the interface voltage for achieving faster data transfer performance, the operating voltage of NAND flash memories used in memory cards remains high. Thus, a flash memory requires a voltage of 3.3 V, and the information processing apparatus needs to supply 3.3 V to the memory card. Consequently, there are information processing systems which supply 3.3 V to the flash memory and supply a low voltage of 1.8 V for the interface signals.

This kind of conventional information processing system is now explained with reference to FIG. 20 and FIG. 21. FIG. 20 is a diagram showing the configuration of a conventional information processing system. The information processing system 2001 is configured from a host device 2002 as the information processing apparatus, and a memory card 2003 as the nonvolatile storage device. The host device 2002 and the memory card 2003 connect a voltage line (VDD) 2030, a ground line (GND) 2031, a clock line (CLK) 2032, a command line (CMD) 2033, and a data line (DAT [3:0]) 2034 as interfaces.

FIG. 21 is a timing chart of the respective interfaces in the conventional information processing system shown in FIG. 20. At time t2101, the host device 2002 applies a voltage to the memory card 2003 via the voltage line 2030.

Subsequently, at time t2102, the host device 2002 waits for the voltage level of the voltage line 2030 to sufficiently reach 3.3 V, and then applies a clock to the clock line 2032. The amplitude of the clock line 2032 at this point in time is 3.3 V. The host device 2002 issues an "initialization command" 2110 to the memory card while oscillating the clock.

Here, the host device 2002 includes inquiry information regarding whether the memory card 2003 can change the interface voltage in the "initialization command" 2110. The memory card 2003 returns, to the host device 2002, a "busy response" 2111 indicating that the initialization is not complete, or a "ready response" 2112 indicating that the initialization is complete. Here, the memory card 2003 returns the "ready response" 2112 upon storing information indicating that the interface voltage is changeable.

Once the initialization of the memory card 2003 is complete, the host device 2002 issues a "voltage change command" 2113 to the memory card 2003. The memory card 2003 returns a "voltage change response" 2114 to the host device 2002, and, at time t2103, drives the command line 2033 and the data line 2034 at ground level.

Subsequently, the host device 2002 detects that the command line 2033 and the data line 2034 are being driven at ground level, and, at time t2104, stops the clock supply to the clock line 2032 and drives it at ground level.

The host device 2002 thereafter changes the interface drive voltage from 3.3 V to 1.8 V. The memory card 2003 recognizes that the clock of the clock line 2032 has been stopped and changes the interface drive voltage from 3.3 V to 1.8 V. Here, since the clock line 2032, the command line 2033, and the data line 2034 are being driven at ground level, there is no change in the level of the respective interfaces.

Moreover, the host device 2002 starts the clock supply to the clock line 2032 at time t2105 which is after the lapse of a predetermined time; for example, after 5 ms, from the time that the clock supply to the clock line 2032 was stopped. The amplitude of the clock line signals at this point in time is 1.8 V.

Meanwhile, the memory card 2003 detects that the clock of the clock line 2032 has been oscillated, and, after driving the command line 2033 to 1.8 V at time t2106, stops the drive of the command line 2033 to realize a high impedance state. Since the command line 2033 is pulled up by the host device 2002, it maintains 1.8 V.

Subsequently, at time t2107, the memory card 2003 drives the data line 2034 to 1.8 V, and thereafter stops the drive of the data line 2034 to realize a high impedance state. Since the data line 2034 is pulled up by the host device 2002, it maintains 1.8 V.

Here, the memory card 2003 can detect an abnormality of the host device 2002 in the processing for changing the interface voltage by detecting the voltage level of the command line 2033 before stopping the drive of the data line 2034 at ground level and driving it to 1.8 V. Specifically, in cases where the host device 2002 is still outputting 3.3 V, since the command line 2033 is pulled up and raised to 3.3 V, the memory card 2003 can detect an abnormality by detecting that the voltage of the command line 2033 is higher than 2.0 V.

The interface voltage is changed from 3.3 V to 1.8 V as described above. Subsequently, the host device 2002 issues a "read command" 2115. The memory card 2003 returns a "read response" 2116, and thereafter outputs read data 2117 via the data line 2034. After completing the required data transfer between the host device 2002 and the memory card 2003, at time t2108, the host device 2002 blocks the application of voltage to the memory card 2003 via the voltage line 2030.

As other conventional technologies, Japanese Patent Application Publication No. 2009-199106 discloses procedures for stably switching the interface voltage, and Japanese Patent Application Publication No. S56-123023 discloses technology for blocking the power source of the storage device during non-use. Moreover, as technology concerning a system which changes the power source supply performance of a host device, Japanese Patent Application Publication No. 2008-217147 discloses technology for variably controlling the power consumption of the storage device.

Nevertheless, none of the foregoing patent documents suggest the possibility of a mismatch in the interface voltages between an information processing apparatus and a nonvolatile storage device in an information processing system, or disclose a processing routine for dealing with the occurrence of such a mismatch.

Here, a mismatch of the interface voltages becomes a factor that leads to a failure of the information processing system. For example, in cases where 3.3 V is supplied as the power supply voltage of the IO driver of the host device 2002 and the memory card 2003, and "H" level signals of 1.8 V are input to the IO driver, a through current flows through the Pch transistor and the Nch transistor which are used for the input of the IO driver. This through current leads to unnecessary power consumption, and, if the voltage source of the host device 2002 is a battery, this will lead to the considerable loss of the duration of the battery.

SUMMARY OF THE INVENTION

On object of the present invention is to provide an information processing apparatus, a nonvolatile storage device, an information processing system and a nonvolatile memory controller capable of avoiding factors that cause system failures by detecting a mismatch of the interface voltages between the information processing apparatus and the nonvolatile storage device.

The information processing apparatus according to one aspect of the present invention is an information processing apparatus connected to a nonvolatile storage device via a voltage line for supplying a power source to the nonvolatile storage device, a clock line for supplying a clock signal to the nonvolatile storage device, and one or more data lines at least one of which is pulled up by the nonvolatile storage device and which are used for bidirectionally communicating data signals with the nonvolatile storage device. This information processing apparatus comprises a voltage switch, a voltage source which is connected to the voltage line via the voltage switch and which supplies a predetermined first voltage to the voltage line, a regulator which is connected to the voltage line and which outputs the first voltage or a second voltage that is lower than the first voltage when the first voltage is applied, an input/output driver for driving the clock line and the data line with the output of the regulator as a power source, a voltage detection circuit for detecting whether a voltage of the data line is the second voltage, or a voltage that is higher than the second voltage, and a control unit for detecting whether a drive voltage of the information processing apparatus and a drive voltage of the nonvolatile storage device are different based on an output voltage of the regulator and a detection result of the voltage detection circuit.

According to the foregoing configuration, it is possible to provide an information processing apparatus, a nonvolatile storage device, an information processing system and a nonvolatile memory controller capable of avoiding factors that cause system failures by detecting a mismatch of the interface voltages between the information processing apparatus and the nonvolatile storage device.

These and other objects, features and advantages of the present invention will become more apparent upon reading the following detailed description along with the accompanying drawings.

DESCRIPTION OF THE PREFERRED EMBODIMENTS

Embodiments of the present invention are now explained with reference to the appended drawings.

(First Embodiment)

Figure 1:
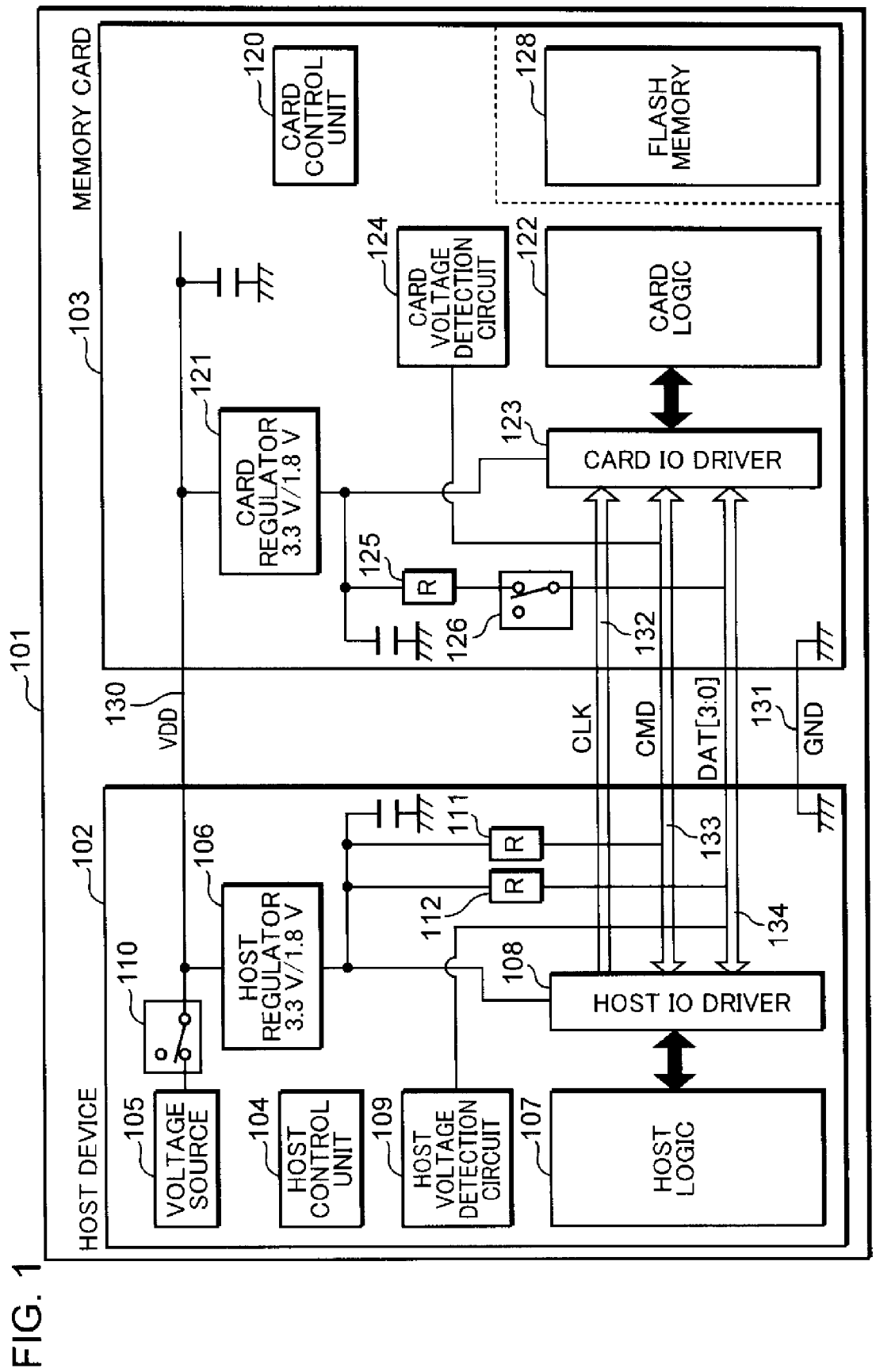
FIG. 1 is a diagram showing the configuration of the information processing system according to the first embodiment of the present invention.

The information processing system according to the first embodiment of the present invention is foremost explained with reference to the drawings. FIG. 1 is a diagram showing the configuration of the information processing system according to the first embodiment of the present invention.

<1. Configuration of Information Processing System>

An information processing system 101 comprises a host device 102 as an example of an information processing apparatus, and a memory card 103 as an example of a nonvolatile storage device. An example of the host device 102 is a digital camera.

The host device 102 is configured so that the memory card 103 can be inserted and removed. Although not shown, by causing the terminal area of the connector of the host device 102 and the terminal area of the memory card 103 to come in physical contact, the host device 102 and the memory card 103 can be electrically connected.

Based on the physical contact of the foregoing terminal areas, a plurality of electrical wirings in the host device 102 and the memory card 103 become electrically connected, and, as the electrical configuration to become the interfaces between the host device 102 and the memory card 103, configured are a voltage line (VDD) 130 for supplying a power source from the host device 102 to the memory card 103, a ground line (GND) 131 connected to the ground potential of the device, a clock line (CLK) 132 for supplying a clock signal (hereinafter also referred to as a "clock") from the host device 102 to the memory card 103, a command line (CMD) 133 for transmitting command inputs from the host device 102 to the memory card 103 and responses from the memory card 103 to the host device 102, and a data line (DAT [3:0]) 134 as a plurality of (for instance, four in this embodiment) signal lines for bidirectionally communicating data signals (hereinafter also referred to as "data") between the host device 102 and the memory card 103. Here, the foregoing command line 133 or the data line 134 is configured as one or more communication lines capable of bidirectionally communicating signals between the host device 102 and the memory card 103.

The host device 102 controls the memory card 103 by issuing commands, and performs the writing of data and reading of data based on a designated address to the memory card 103. The memory card 103 stores the data written from the host device 102 in a nonvolatile manner.

The host device 102 comprises a host control unit 104, a voltage source 105, a host regulator 106, a host logic 107, a host IO (input/output) driver 108, a host voltage detection circuit 109, a host voltage switch 110, a host command pull-up resistor 111, and a host data pull-up resistor 112.

The host control unit 104 is connected to the respective blocks via wirings not shown, and controls the overall host device 102 by controlling the operation of the respective blocks.

The voltage source 105 is the voltage source of the host device 102, and is also the voltage source for supplying a power source to the memory card 103. Here, the supply of the power source to the memory card 103 via the voltage line 130 is performed at 3.3 V. Note that the power supply voltage for normally operating the memory card 103 needs to be within the range of 2.7 V to 3.6 V.

For example, when digital cameras and mobile phones are connected to a battery or an AC adapter, the voltage source 105 supplies a voltage which is dropped from a commercial voltage to 3.3 V as the operating voltage within the host device 102. Note that, when a battery is being used as the drive source, the voltage supplied by the voltage source 105 gradually decreases pursuant to the consumption of the battery, and, in certain cases, it may not be possible to obtain a stable voltage.

Based on the voltage of the voltage source 105, the host regulator 106 supplies, to the host IO driver 108, 3.3 V as the voltage of the voltage source 105 or 1.8 V as the voltage that was dropped with the host regulator 106.

Note that, in the ensuing descriptions including this embodiment, 3.3 V and 1.8 V are used as the voltage values to be output by the host regulator 106 (and the card regulator 121 described later) for ease of explanation, but the effect of the present invention is not limited to a specific voltage.

The host logic 107 is a logic circuit inside the host device 102, and creates clocks, commands and data to be output to the host IO driver 108, and performs processing of commands (responses) and data to be input from the host IO driver 108.

The host IO driver 108 drives the clock line 132, the command line 133, and the data line 134 as interfaces with the voltage supplied from the host regulator 106 as the power source.

The host voltage detection circuit 109 detects whether the voltage level of the data line 134 of the interface; for example, whether the voltage of the data line 134 is 1.8 V, or a voltage that is higher than 1.8 V. The specific detection voltage will differ depending on the resistance value of the host data pull-up resistor 112 of the data line 134, or the resistance value based on the connection or non-connection of the card data pull-up resistor 125. As an example, the detection voltage is set to 2.3 V between 1.8 V and 2.7 V, or 2.1 V between 1.8 V and (1.8 V+2.7 V)/2, or 2.5 V between (1.8 V+2.7 V)/2 and 2.7 V.

The host voltage switch 110 is a switch for switching whether to connect the voltage source 105 and the voltage line 130.

The host command pull-up resistor 111 is configured, for example, from a high-value resistor of several ten K ohms, and connects the output of the host regulator 106 and the command line 133. The host data pull-up resistor 112 is configured, for example, from a high-value resistor of several ten K ohms, and connects the output of the host regulator 106 and the data line 134.

The host command pull-up resistor 111 and the host data pull-up resistor 112 are used for preventing the voltage (potential) of the command line 133 and the data line 134 from becoming a midpoint potential. Accordingly, the host data pull-up resistor 112 is connected all of the plurality of data lines 134.

Note that, although not shown since it is not directly related to the present invention, for example, if the host device 102 is a digital camera, the lens, LCD monitor, switches and the like are also included in the host device 102. Moreover, for example, if the host device 102 is a mobile phone, the speaker, microphone, antenna and the like are also included in the host device 102.

The memory card 103 comprises a card control unit 120, a card regulator 121, a card logic 122, a card IO (input/output) driver 123, a card voltage detection circuit 124, a card data pull-up resistor 125, a card data pull-up switch 126, and a flash memory 128. Here, the portion excluding the flash memory 128 within the memory card 103 is the nonvolatile memory controller. The memory card 103 generally comprises one nonvolatile memory controller and one or more flash memories, and is configured from a plurality of semiconductor chips.

The card control unit 120 is connected to the respective blocks via wirings not shown, and controls the overall memory card 103 by controlling the operation of the respective blocks.

The card regulator 121 supplies to the card IO driver 123, based on the control of the card control unit 120, 3.3 V as the voltage that is applied from the host device 102 via the voltage line 130 or 1.8 V as the voltage that was dropped by the card regulator 121. However, the card regulator 121 outputs 3.3 V in the initial state where voltage is applied to the memory card 103.

Moreover, although the card regulator 121 has the function of changing the output voltage of 3.3 V to 1.8 V, it does not have the function of changing the output voltage of 1.8 V to 3.3 V. Accordingly, it is necessary to once turn off the power source of the memory card 103 in order to change the output voltage of 1.8 V to 3.3 V.

The card logic 122 is a logic circuit inside the memory card 103, and creates clocks, responses and data to be output to the card IO driver 123, and performs processing of commands and data to be input from the card IO driver 123.

The card IO driver 123 drives the command line 133 and the data line 134 as interfaces with the voltage supplied from the card regulator 121 as the power source.

The card voltage detection circuit 124 detects whether the voltage level of the command line 133 of the interface; for example, whether the voltage of the command line 133 is 1.8 V, or a voltage that is higher than 1.8 V. Since the specific detection voltage is used for determining whether the voltage after the interface voltage has been changed is maintained, it is set, for example, to 2.0 V as a voltage that is higher than 1.8 V. Note that the voltage that is detected by the card voltage detection circuit 124 is not particularly limited to the voltage of the foregoing command line 133, and may also be the voltage of the data line 134 that is driven by the host device 102. This point also applies to the subsequent embodiments.

The card data pull-up resistor 125 is configured, for example, from a high-value resistor of several ten K ohms, and connects the output of the card regulator 121 and the data line 134 via the card data pull-up switch 126. Since the card data pull-up resistor 125 is used upon detecting a mismatch of the interfaces, it only needs to be connected to one among the plurality of data lines 134, and it will suffice so as long as at least one data line 134 is pulled up by the memory card 103. Moreover, the number of data lines is not particularly limited to the foregoing example, and it may be another number of one or more.

The card data pull-up switch 126 is a switch for switching whether to connect the card data pull-up resistor 125 and the data line 134.

The flash memory 128 is a nonvolatile memory inside the memory card 103 for storing, in a nonvolatile manner, data to be read or written from the host device 102.

Note that, although an example of a configuration where the memory card 103 is insertable to and removable from the host device 102 was explained, the present invention is not limited to such insertable/removable configuration. So as long as it is a configuration where interfaces that operate based on different voltage sources exist in the host device 102 and the memory card 103; for example, a configuration where the data lines 134 are driven by the host regulator 106 and the card regulator 121, the present invention can be applied even to configurations where the memory card 103 is physically fixed to the host device 102. Moreover, although a flash memory was explained as an example of a nonvolatile memory, other memories capable of storing data in a nonvolatile manner can also be used. These points also apply to the subsequent embodiments.

<2. Status of Memory Card>

Figure 2:
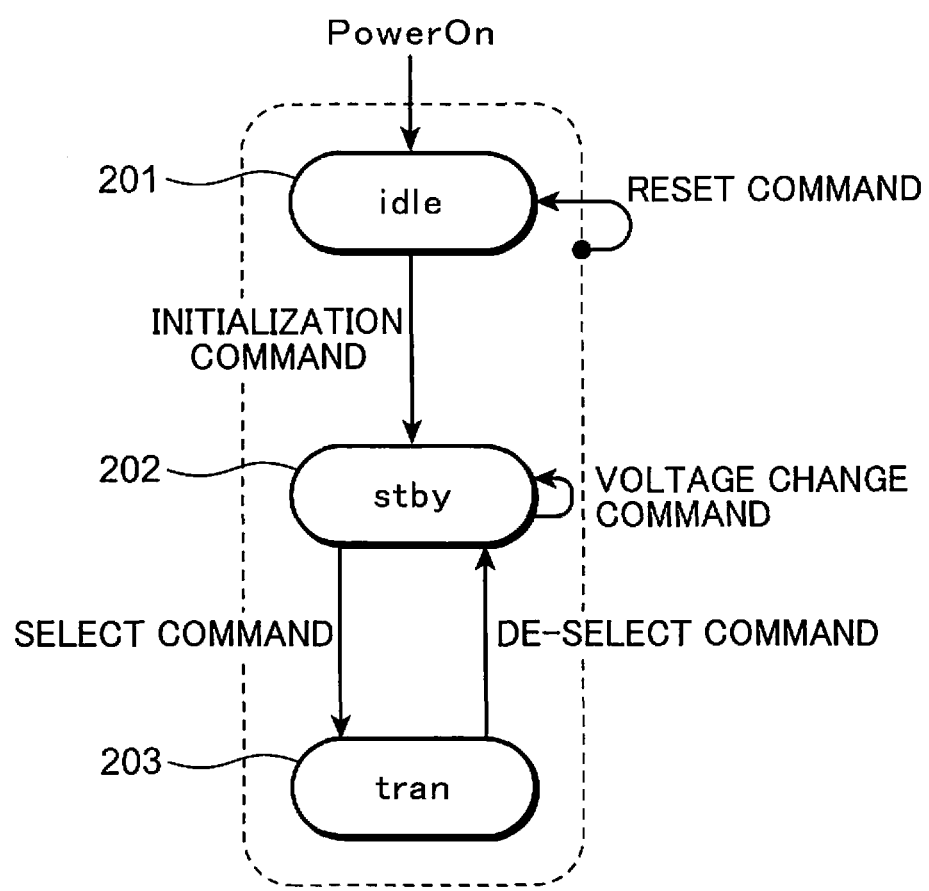
FIG. 2 is a transition diagram of the internal status of the nonvolatile storage device according to the first embodiment of the present invention.

FIG. 2 is a transition diagram of the internal status of the memory card 103. When a voltage is applied to the voltage line 130 of the memory card 103, the status of the memory card 103 becomes "idle" 201. Moreover, the "idle" 201 status is changed to a "stby" 202 status based on an "initialization command," the "stby" 202 status is changed to a "tran" 203 status based on a "select command," and the "tran" 203 status is changed to the "stby" 202 status based on a "de-select command." Moreover, an arbitrary status is changed to the "idle" 201 status based on a "reset command," and, in the "stby" 202 status, the output voltage is changed from 3.3 V to 1.8 V based on a "voltage change command."

Figure 3:
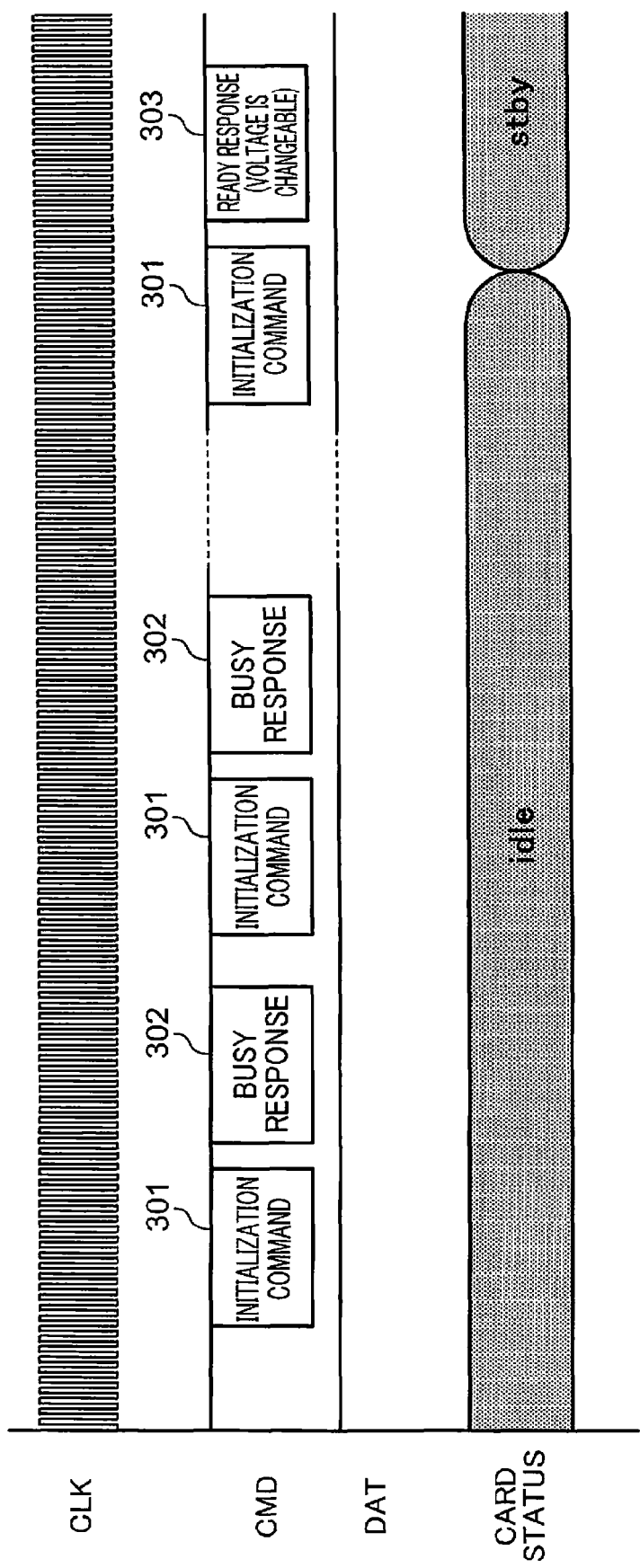
FIG. 3 is a timing chart showing the first transition state of the internal status of the nonvolatile storage device according to the first embodiment of the present invention.

FIG. 3 is a timing chart upon changing from the "idle" 201 status to the "stby" 202 based on the "initialization command." FIG. 3 shows, in order from the top, the signal CLK of the clock line 132, the operation CMD of the command line 133, the operation DAT of the data line 134, and the internal status of the memory card 103.

Foremost, when an "initialization command" 301 is issued from the host device 102 via the command line 133 in the "idle" 201 status, the memory card 103 returns a "busy response" 302 to the host device 102 via the command line 133, and the card control unit 120 starts the internal initialization operation of the memory card 103.

Here, the host device 102 issues the "initialization command" 301 until a "ready response" is returned from the memory card 103. When the internal initialization operation of the memory card 103 is complete, the memory card 103 changes the status of the memory card 103 to "stby" 202, and returns, to the host device 102, a "ready response" 303 in response to the "initialization command" 301 from the host device 102 via the command line 133.

Here, the memory card 103 stores information regarding whether the interface voltage is changeable in the foregoing "ready response." In other words, if the output voltage of the card regulator 121 is 3.3 V, since 3.3 V can be changed to 1.8 V, the memory card 103 stores information to the effect that the voltage is changeable in the "ready response." Meanwhile, if the output voltage of the card regulator 121 is 1.8 V, since the voltage has already been changed, the memory card 103 stores information to the effect that the voltage is not changeable in the "ready response."

Note that the communication of commands and responses via the command line 133 and the writing and reading of data via the data line 134 are performed in synch with the clock of the clock line 132. Accordingly, the timing charts of FIG. 3 onward show a state where the clock of the clock line 132 is constantly oscillated. Nevertheless, if there is a period where the transfer of commands, responses and data is not required, the oscillation of the clock of the clock line 132 may or may not be performed.

Figure 4:
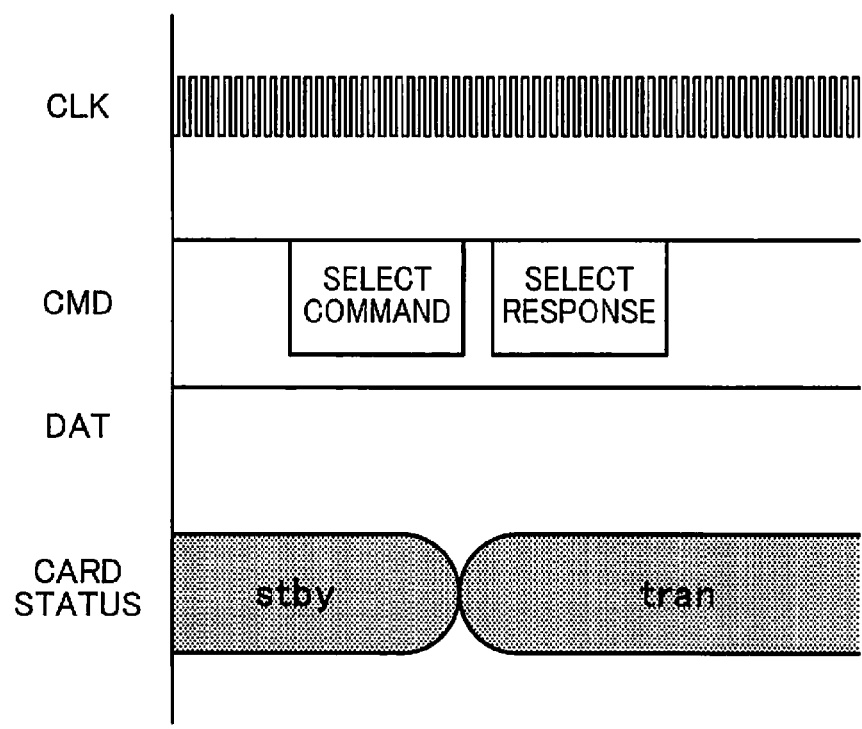
FIG. 4 is a timing chart showing the second transition state of the internal status of the nonvolatile storage device according to the first embodiment of the present invention.

FIG. 4 is a timing chart upon changing from the "stby" 202 status to the "tran" 203 status based on the "select command." FIG. 4 shows, in order from the top, the signal CLK of the clock line 132, the operation CMD of the command line 133, the operation DAT of the data line 134, and the internal status of the memory card 103.

Foremost, when a "select command" is issued from the host device 102 via the command line 133 in the "stby" 202 status, the memory card 103 changes the status of the memory card 103 to "tran" 203, and returns a "select response" to the host device 102 via the command line 133.

Although not particularly shown, if a "de-select command" is issued from the host device 102 via the command line 133 in the "tran" 203 status, the memory card 103 changes the status of the memory card 103 to "stby" 202, and returns a "de-select response" to the host device 102 via the command line 133.

Figure 5:
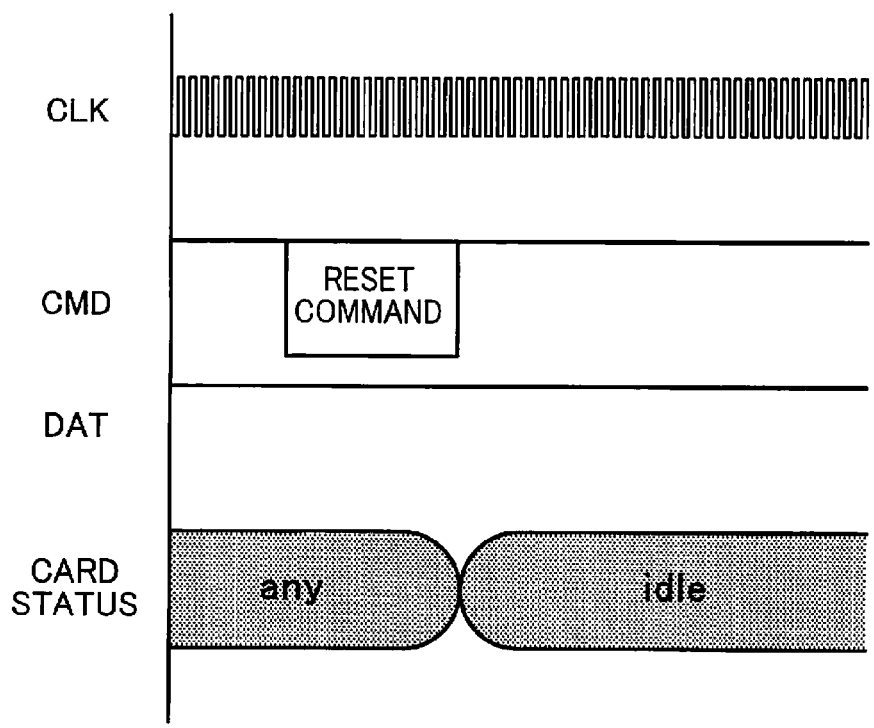
FIG. 5 is a timing chart showing the third transition state of the internal status of the nonvolatile storage device according to the first embodiment of the present invention.

FIG. 5 is a timing chart upon changing from an arbitrary status of the memory card 103 to the "idle" status based on the "reset command." FIG. 5 shows, in order from the top, the signal CLK of the clock line 132, the operation CMD of the command line 133, the operation DAT of the data line 134, and the internal status of the memory card 103.

When a "reset command" is issued from the host device 102 via the command line 133 in an arbitrary status of the memory card 103, the memory card 103 changes the status of the memory card 103 to "idle" 201 without returning a response to the host device 102.

<3. Control Sequence of Host Device>
<3.1. Sequence During Normal Operation>

Figure 6:
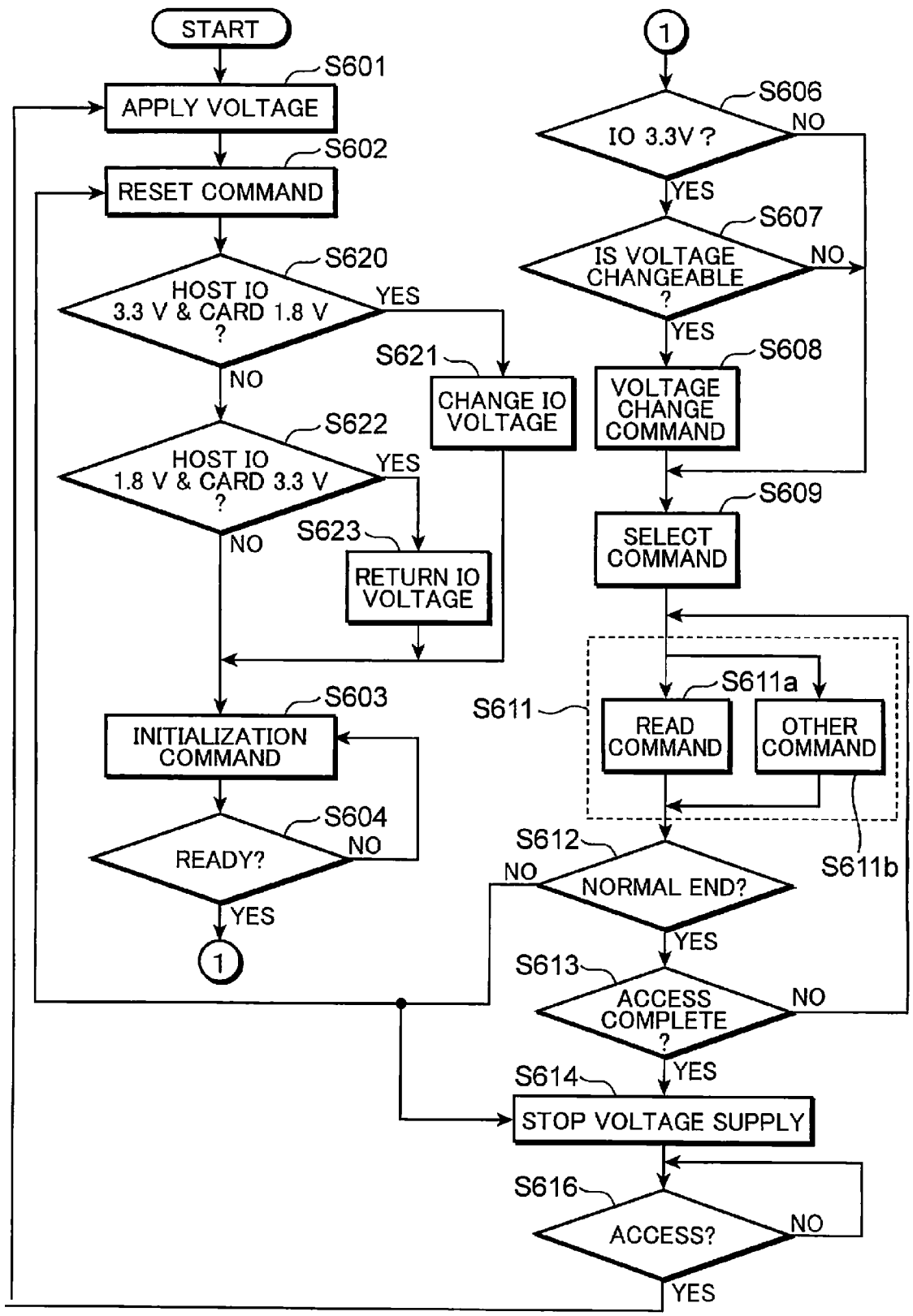
FIG. 6 is a flowchart explaining the control processing of the information processing system according to the first embodiment of the present invention.

FIG. 6 is a flowchart explaining the control processing for the host device 102 to control the memory card 103. Note that, as the initial status, the host voltage switch 110 is in a state of not connecting the voltage line 130 to the voltage source 105.

Foremost, at processing S601, the host device 102 switches the host voltage switch 110 and applies a voltage of 3.3 V of the voltage source 105 to the memory card 103 via the voltage line 130. The memory card 103 changes to the "idle" 201 status as a result of a power source being supplied to the voltage line 130. Moreover, simultaneously, the host device 102 causes the host regulator 106 to become a status of supplying 3.3 V to the host IO driver 108.

Subsequently, at processing S602, the host device 102 issues a "reset command" to the memory card 103. Here, the memory card 103 remains in the "idle" 201 status. Subsequent determination processing S620, determination processing S622, processing S621, and processing S623 are explained later.

Subsequently, at processing S603, the host device 102 issues an "initialization command" to the memory card 103. At determination processing S604, the host device 102 determines whether the response from the memory card 103 is a "busy response" or a "ready response." If the response is a "busy response" the routine returns to processing S603, and if the response is a "ready response" the routine proceeds to determination processing S606. The timing chart at this point in time is shown in FIG. 3.

Here, in a state where there is no mismatch in the interface voltages between the memory card 103 and the host device 102, the "ready response" returned by the memory card 103 contains information to the effect that the voltage is changeable; that is, the voltage of the card regulator 121 is 3.3 V and this voltage can be changed to 1.8 V.

If the response is a "ready response," at determination processing S606, the host device 102 determines whether the output voltage (IO) of the host regulator 106 is 3.3 V or 1.8 V, and proceeds to determination processing S607 if the output voltage is 3.3 V, and proceeds to processing S609 if the output voltage is 1.8 V.

If the output voltage is 3.3 V, at determination processing S607, the host device 102 determines whether the voltage of the memory card 103 can be changed based on the information stored in the "ready response" of the memory card 103.

The routine proceeds to processing S608 if the voltage is changeable, and proceeds to processing S609 if the voltage is not changeable.

If the voltage is changeable, at processing S608, the host device 102 issues a "voltage change command" to the memory card 103, and changes the output voltage of the host regulator 106 from 3.3 V to 1.8 V.

Figure 7:
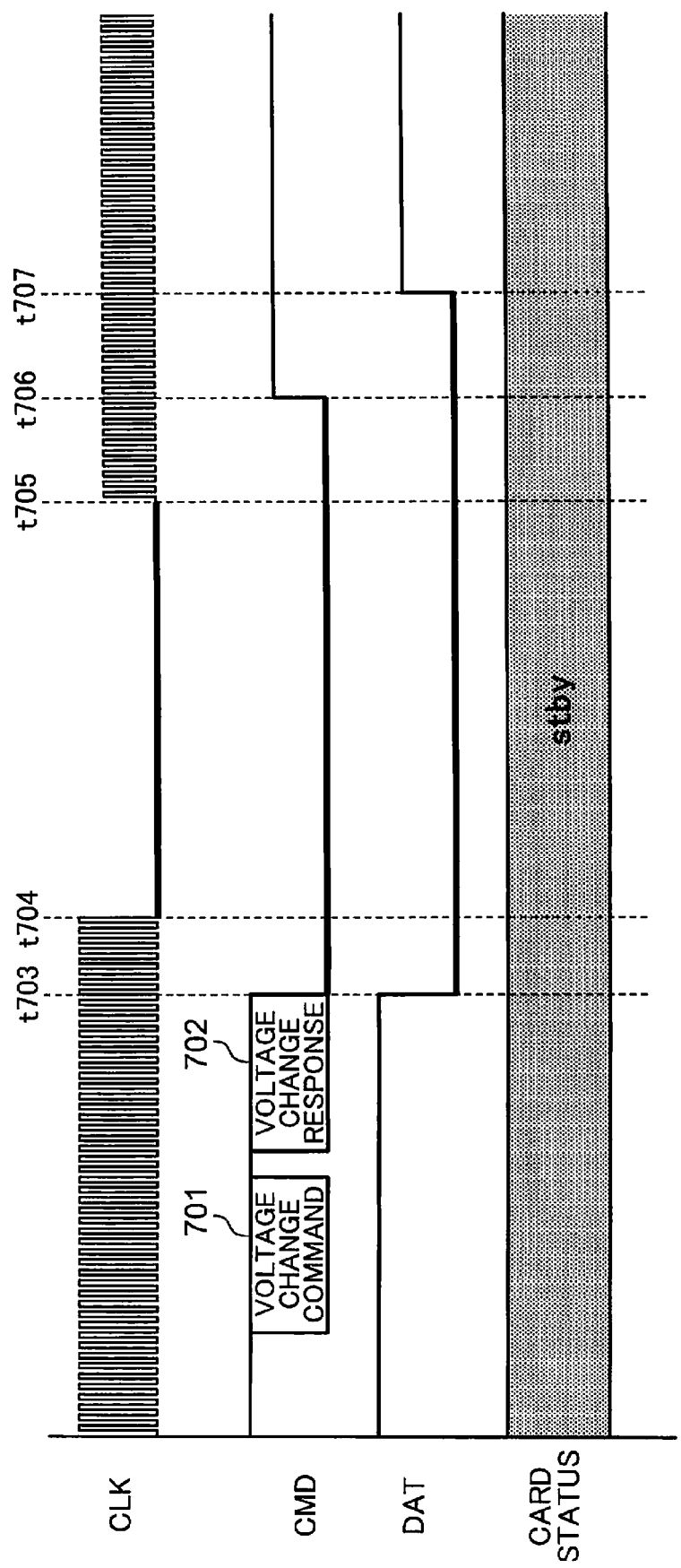
FIG. 7 is a timing chart upon the voltage change of the information processing system according to the first embodiment of the present invention.

FIG. 7 is a timing chart explaining an example of the voltage change processing for changing the interface voltage at processing S608. FIG. 7 shows, in order from the top, the signal CLK of the clock line 132, the operation CMD of the command line 133, the operation DAT of the data line 134, and the internal status of the memory card 103.

Foremost, when a "voltage change command" 701 is issued from the host device 102 via the command line 133, the memory card 103 returns a "voltage change response" 702 to the host device 102 via the command line 133, and, at time t703, the memory card 103 drives the command line 133 and the data line 134 at ground level.

Here, the host the device 102 detects that the command line 133 and the data line 134 are being driven at ground level, and, at time t704, stops the clock supply to the clock line 132 and drives the clock line 132 at ground level.

The host device 102 thereafter changes the output voltage of the host regulator 106 from 3.3 V to 1.8 V. Here, although the voltage for driving the host IO driver 108 is also changed from 3.3 V to 1.8 V, since the clock line 132 is being driven at ground level and the command line 133 and the data line 134 are only pulled up and not driven, there is no change in the clock line 132, the command line 133, and the data line 134.

Subsequently, the memory card 103 recognizes that the clock of the clock line 132 has been stopped, and changes the output voltage of the card regulator 121 from 3.3 V to 1.8 V. Here, although the voltage for driving the card IO driver 123 is also changed from 3.3 V to 1.8 V, since the command line 133 and the data line 134 are being driven at ground level, there is no change in the clock line 132, the command line 133, and the data line 134.

Accordingly, during the period that the clock line 132, the command line 133, and the data line 134 are at ground level, the host IO driver 108 and the card IO driver 123 are changed to a state of being driven at 1.8 V.

Subsequently, the host device 102 starts the clock supply to the clock line 132 at time t705 which is after the lapse of a predetermined time; for example, after 5 ms, from the time that the clock supply to the clock line 132 was stopped. The amplitude of the signal of the clock line 132 at this point in time is 1.8 V.

Subsequently, the memory card 103 detects that the clock of the clock line 132 has been oscillated, and, after driving the command line 133 to 1.8 V at time t706, stops the drive of the command line 133 to realize a high impedance state. Since the command line 133 is pulled up by the host command pull-up resistor 111 of the host device 102, it maintains 1.8 V.

Subsequently, at time t707, the memory card 103 drives the data line 134 to 1.8 V, and thereafter stops the drive of the data line 134 to realize a high impedance state. Since the data line 134 is pulled up by the host data pull-up resistor 112 of the host device 102, it maintains 1.8 V.

The interface voltage is changed from 3.3 V to 1.8 V as described above.

Note that the memory card 103 can detect an abnormality of the host device 102 in the processing of changing the interface voltage by detecting the voltage level of the command line 133 based on the card voltage detection circuit 124 before stopping the drive of the data line 134 at ground level and driving it to 1.8 V.

For example, in cases where the host regulator 106 of the host device 102 is still outputting 3.3 V, since the voltage of the command line 133 raised to 3.3 V by the host command pull-up resistor 111, the memory card 103 can detect an abnormality of the host device 102 as a result of the card voltage detection circuit 124 detecting that the voltage of the command line 133 is higher than 2.0 V. When an abnormality is detected, the memory card 103 stops the subsequent processing and counts on the power source to be blocked.

Returning once again to FIG. 6, at processing S609, the host device 102 issues a "select command" to the memory card 103 and changes the status of the memory card 103 to "tran." The timing chart at this point in time is also shown in FIG. 4.

Subsequently, at processing S611, the host device 102 issues a "read command" to the memory card 103 (processing S611*a*) and reads data that was written in the memory card 103 in advance, or, by issuing other commands (processing S611*b*), writes data into the memory card 103 or deletes data stored inside the memory card 103.

Figure 8:
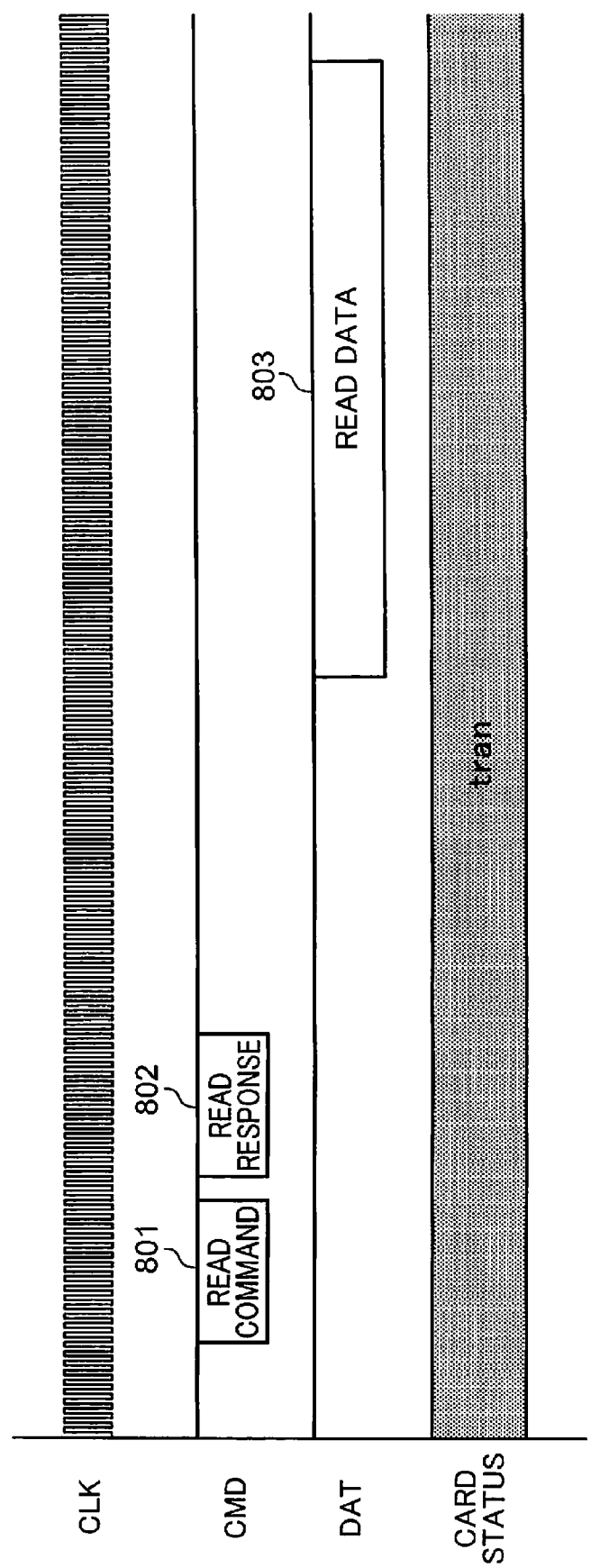
FIG. 8 is a timing chart upon the internal read processing of the nonvolatile storage device according to the first embodiment of the present invention.

FIG. 8 is a timing chart upon the host device 102 issuing a "read command" to the memory card 103. FIG. 8 shows, in order from the top, the signal CLK of the clock line 132, the operation CMD of the command line 133, the operation DAT of the data line 134, and the internal status of the memory card 103.

When a "read command" 801 is issued from the host device 102 via the command line 133 in a state where the memory card 103 is in the "tran" status, the memory card 103 returns a "read response" 802 to the host device 102 via the command line 133, and the card control unit 120 controls the flash memory 128 to prepare the read data to be output to the host device 102. When the read data is prepared, the memory card 103 outputs the read data 803 to the host device 102 via the data line 134 in synch with the clock of the clock line 132.

Returning once again to FIG. 6, at determination processing S612, the host device 102 determines whether processing S611 ended normally. For example, if there is an abnormality such as a response that should be returned from the memory card 103 not being returned and the host device 102 determines that it is necessary to issue a "reset command" to the memory card 103, the routine proceeds to processing S602. Moreover, if the host device 102 determines that it is necessary to restore the supply of voltage to the memory card 103, the routine proceeds to processing S614. Meanwhile, if the host device 102 determines that processing S611 ended normally, the routine proceeds to determination processing S613.

Subsequently, at determination processing S613, the host device 102 determines whether access such as the reading or writing of data from and to the memory card 103 is still required by determining whether access to the memory card 103 is complete, or whether to reduce the power consumption of the information processing system 101 by stopping the voltage supply. Since the voltage source 105 of the information processing system 101 is often configured from a battery, it is necessary to switch the voltage supply in units of ms in order to prolong the duration of the battery. If access to the memory card 103 is not complete, the routine proceeds to processing S610, and, if access to the memory card 103 is complete and the voltage supply is to be stopped, the routine proceeds to processing S614.

Subsequently, at processing S614, the host device 102 switches the host voltage switch 110 and stops the supply of voltage from the voltage source 105 to the voltage line 130.

Subsequently, at determination processing S616, the host device 102 determines whether access such as the reading or writing of data from and to the memory card 103 is newly required by determining whether there is access to the memory card 103, or whether to continue stopping the voltage supply. If there is no access to the memory card 103 and stoppage of the voltage supply is to be continued, determination processing S616 is continued. Meanwhile, if there is access to the memory card 103 and the reading or writing of data is to be performed, the routine proceeds to processing S601.

After the supply of voltage from the host device 102 is stopped at processing S614, the potential of the voltage line 130 gradually drops. If sufficient time elapses thereafter and the potential of the voltage line 130 sufficiently drops, and the voltage of the voltage line 130 becomes 0.5 V or less for a period of, for example, 1 ms or longer, the memory card 103 recognizes that the power source has been blocked. In the foregoing case, based on the application of voltage after processing is performed in the order of determination processing S616 and processing S601, the memory card 103 recognizes that the power has been cycled and enters the "idle" status.

<3.2. Mismatch of Interface Voltages>

After the supply of voltage is stopped at processing S614, if the routine proceeds to the application of voltage at processing S601 without the lapse of sufficient time, the memory card 103 is unable to recognize that the power source has been blocked. In the foregoing case, a mismatch of the interface voltages will occur as described below.

Figure 9:
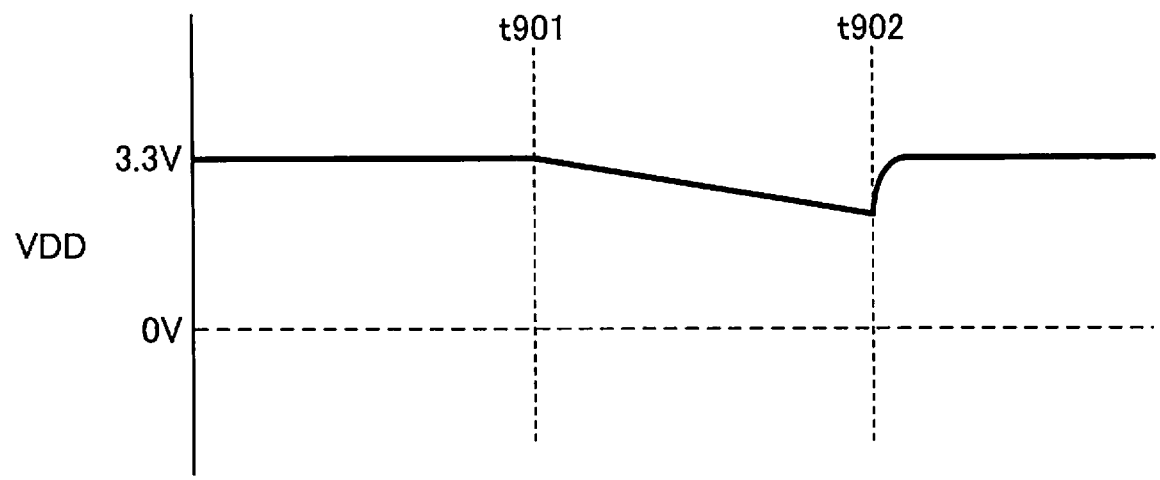
FIG. 9 is a diagram showing an example of the voltage change of the voltage line in cases where the voltage of the voltage line does not drop sufficiently.

FIG. 9 is a diagram showing an example of the voltage change of the voltage line 130 in cases where the voltage of the voltage line 130 does not drop sufficiently. In the example shown in FIG. 9, the timing of time t901, the supply of voltage is stopped based on processing S614. Although the voltage will gradually drop thereafter, since the memory card 103 is not operating and the power consumption is low, the voltage (potential) of the voltage line 130 will not drop rapidly. Subsequently, when the supply of voltage is started based on processing S601 at the timing of time t902, the memory card 103 is unable to recognize that the power source has been blocked. Thus, the card regulator 121 continues to supply 1.8 V to the card IO driver 123. If this operation is continued, a mismatch will occur between the voltage of 3.3 V or driving the host IO driver 108 of the host device 102 and the voltage of 1.8 V for driving the card IO driver 123 of the memory card 103.

Moreover, since a configuration where the memory card 103 is insertable to and removable from the host device 102 configuring the information processing system 101 can also be adopted, there may be cases where the voltage that is being supplied to the memory card 103 is block when the host device 102 is unable to recognize the memory card 103, and the power source of the memory card 103 may deteriorate.

For example, if the host device 102 is dropped, the contact area of the host device 102 and the memory card 103 may become separated in units of ms due to the impact from the drop, and cause the instantaneous interruption of the power source to the memory card 103. Even if the instantaneous interruption occurs when the memory card 103 is not operating, the drop in the voltage of the memory card 103 will not become a problem. However, if the instantaneous interruption occurs when the memory card 103 is operating, the power supply voltage of the memory card 103 will drop drastically due to the self-power consumption of the memory card 103. Even in the foregoing case, a mismatch of the interface voltages will occur as described below.

Figure 10:
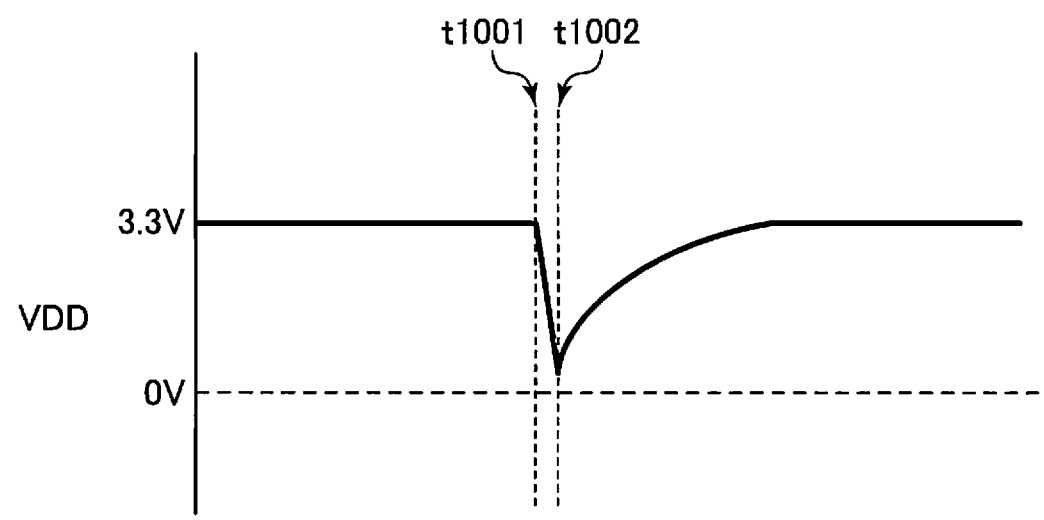
FIG. 10 is a diagram showing an example of the voltage change of the voltage line in cases where the memory card is subject to instantaneous interruption.

FIG. 10 is a diagram showing an example of the voltage change of the voltage line 130 in cases where the memory card 103 is subject to instantaneous interruption. In the example shown in FIG. 10, at time t1001, the terminal area of the memory card 103 becomes separated and the voltage of the voltage line 130 drops, and, thereafter at time t1002, the terminal area of the memory card 103 makes contact and the voltage of the voltage line 130 is returned.

Here, at the timing of time t1002, if the voltage has sufficiently dropped, the memory card 103 will recognize that the power source was once turned off. Thus, even if the voltage is subsequently returned, the memory card 103 will be in the "idle" status and the card regulator 121 supplies, to the card IO driver 123, 3.3 V as the voltage supplied from the voltage line 130. Here, since the memory card 103 is in the "idle" status, it is unable to normally process a "read command."

The host device 102 can detect the foregoing abnormality at determination processing S612, and then proceeds to processing S602. Consequently, a mismatch will occur between the voltage of 1.8 V for driving the host IO driver 108 of the host device 102 and the voltage of 3.3 V for driving the card IO driver 123 of the memory card 103.

By way of reference, with a mismatch of the interface voltages of 3.3 V and 1.8 V, it cannot be said that this will directly lead to an abnormal operation of the circuit. Normal operation is possible if a signal of 0 V to 3.3 V is input to a circuit with a power source of 1.8 V, and the "L" level and "H" level can be correctly recognized even if a signal of 0 V to 1.8 V is input to a circuit with a power source of 3.3 V.

When consideration a TTL interface, 1.8 V is close to a sufficient high input level relative to a high input level of 2.0 V and a low input level of 0.8 V. Moreover, when considering a CMOS interface, 1.8 V is higher than 1.65 V, which is half of 3.3 V of the power source. Accordingly, the "H" level and "L" level can be properly recognized logically.

Here, the host IO driver 108 preferably recognizes 1.8 V as a high level when 3.3 V is being supplied as the drive voltage, and, in the foregoing case, even if a mismatch of the interface voltages occurs, the "H" level and "L" level can be properly recognized logically, and abnormal operations of the circuit that occur directly can be avoided.

Figure 11:
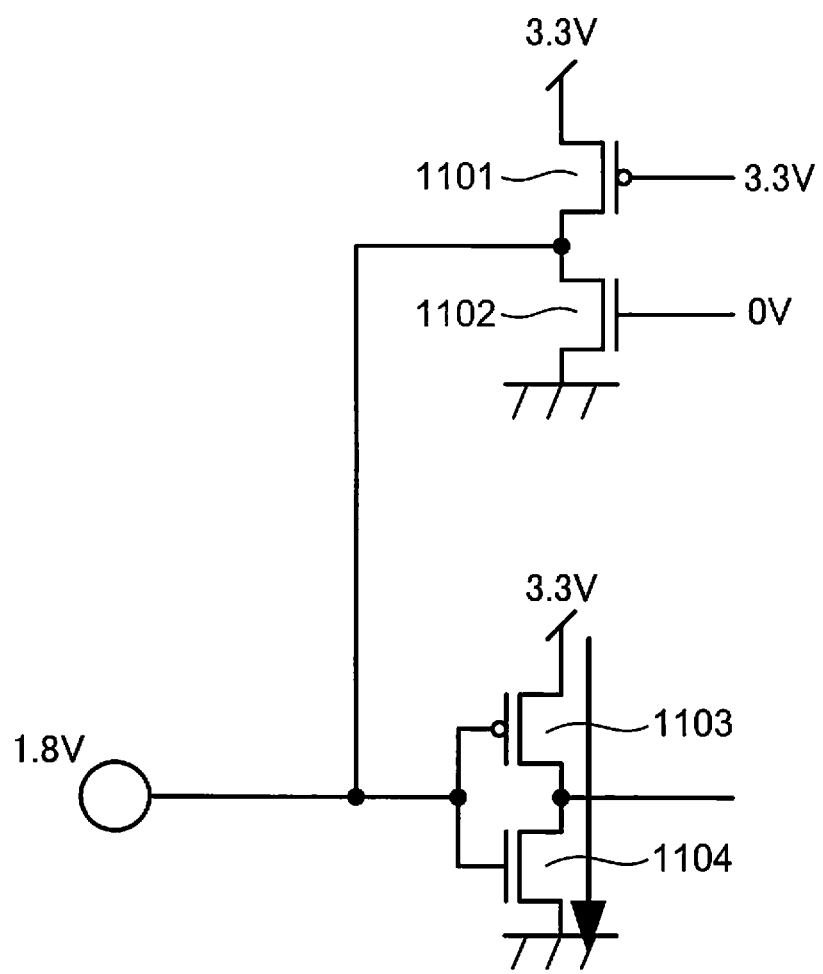
FIG. 11 is a diagram explaining the status of the circuit of the IO part upon a mismatch of the interface voltages.

Nevertheless, even if the "H" level and "L" level can be properly recognized logically, there is a problem in that a mismatch of the interface voltages will still occur. FIG. 11 is a diagram explaining the status of the circuit of the IO (input/output) part upon a mismatch of the interface voltages.

The IO part shown in FIG. 11 is used by the host IO driver 108 and/or the card IO driver 123, 3.3 V is supplied as the power supply voltage of the IO part, the IO part operates based on this voltage, and an "H" level signal of 1.8 V is input.

Here, the Pch transistor 1101 and Nch transistor 1102 used for outputs are in a cut-off status. Nevertheless, since the Pch transistor 1103 and Nch transistor 1104 used for inputs are both of an ON status, a through current flows therethrough. The through current of the IO part leads to unnecessary power consumption, and, if the voltage source 105 is a battery, this will lead to the considerable loss of the duration of the battery.

<3.3. Detection of Mismatch of Interface Voltages>

In order to avoid the unnecessary power consumption caused by the foregoing mismatch of interface voltages, the host device 102 needs to detect a mismatch of the interface voltages. Since the host control unit 104 of the host device 102 is controlling the host regulator 106, it can recognize the voltage that is being supplied to the host IO driver 108. Moreover, the host control unit 104 of the host device 102 detects the voltage (potential) of the data line 134 with the host voltage detection circuit 109 in order to determine the voltage that is being supplied to the card 10 driver 123.

In order to recognize the voltage that is being supplied to the card IO driver 123 based on the voltage (potential) of the data line 134, the host device 102 needs to detect the voltage in a state where the data line 134 is maintaining the "H" level. In order to achieve the above, for example, the host control unit 104 of the host device 102 issues a "reset command" to the memory card 103 and causes it to enter the "idle" status by controlling the host logic 107 and the host IO driver 108, and uses a state where the data line 134 maintains the "H" level during the period that a new command is thereafter issued for detecting the voltage.

Moreover, in order to recognize the voltage that is being supplied to the card IO driver 123, the host control unit 104 of the host device 102 needs to control the card data pull-up switch 126 so that the data line 134 becomes a state of being connected with the card data pull-up resistor 125 in the memory card 103. In order to achieve the above, for example, the host control unit 104 of the host device 102 issues a "reset command" to the memory card 103 by controlling the host logic 107 and the host IO driver 108, and controls the card data pull-up switch 126 so that the card regulator 121 and the data line 134 become connected via the card data pull-up resistor 125.

As described above, as a result of waiting a given period of time until the voltage (potential) of the data line 134 becomes sufficiently stable based on the host data pull-up resistor 112 and the card data pull-up resistor 125 in a state where the level of the data line 134 does not change and a state where the data line 134 is pulled up in the memory card 103 and the host voltage detection circuit 109 detecting the voltage of the data line 134 as described below, the host control unit 104 of the host device 102 can determine the voltage that is being supplied to the card IO driver 123.

For example, when the host regulator 106 is outputting 3.3 V and the card regulator 121 is also outputting 3.3 V, the voltage of the data line 134 is 3.3 V.

For example, if the host regulator 106 is outputting 3.3 V and the card regulator 121 is outputting 1.8 V, the voltage of the data line 134 is a value that is based on the resistance values of the host data pull-up resistor 112 and the card data pull-up resistor 125. If the resistance value of the host data pull-up resistor 112 and the resistance value of the card data pull-up resistor 125 are approximately the same resistance value, the voltage of the data line 134 is approximately 2.55 V.

For example, if the host regulator 106 is outputting 1.8 V and the card regulator 121 is also outputting 1.8 V, the voltage of the data line 134 is 1.8 V.

For example, if the host regulator 106 is outputting 1.8 V and the card regulator 121 is outputting 3.3 V, the voltage of the data line 134 is a value that is based on the resistance values of the host data pull-up resistor 112 and the card data pull-up resistor 125. If the resistance value of the host data pull-up resistor 112 and the resistance value of the card data pull-up resistor 125 are approximately the same resistance value, the voltage of the data line 134 is approximately 2.55 V.

As described above, the host control unit 104 controls the pull-up or non-pull-up of the data line 134 in the memory card 103, and the host voltage detection circuit 109 detects the voltage of the data line 134 after the host device 102 applies a voltage to the memory card 103 and before the host device 102 reads the data stored in the memory card 103 in a non-volatile manner. Consequently, since the data line 134 can be pulled up in the memory card 103, it is possible to realize a state where the data line 134 is maintaining the "H" level in the memory card 103, and detect the voltage of the data line 134 in a state where the data line 134 is maintaining the "H" level. Thus, it is possible to accurately detect the drive voltage of the memory card 103.

Note that, if processing is performed so that the host data pull-up resistor 112 is not connected upon determining the voltage that is being supplied to the card IO driver 123, the voltage of the card regulator 121 will become the voltage of the data line 134 without change. For example, as with the memory card 103, it is also possible to control the pull-up or non-pull-up of the data line 134 in the host device 102 by disposing a host data pull-up switch (not shown) between the host data pull-up resistor 112 and the data line 134, and the host control unit 104 controlling the host data pull-up switch.

<3.4. Recovery Processing Upon Interface Mismatch>

Returning once again to the flowchart of FIG. 6, the recovery processing upon the foregoing interface mismatch is now explained. At determination processing S620, the host control unit 104 of the host device 102 determines the supply voltage to the host IO driver 108 and the supply voltage to the card IO driver 123. If it is determined that the supply voltage to the host IO driver 108 is 3.3 V and the supply voltage to the card IO driver 123 is 1.8 V, the routine proceeds to processing S621, and otherwise proceeds to determination processing S622.

If the supply voltage to the host IO driver 108 is 3.3 V and the supply voltage to the card 10 driver 123 is 1.8 V, at processing S621, the host control unit 104 of the host device 102 changes the (input/output) voltage. Specifically, the host control unit 104 controls the host regulator 106 and switches the output voltage of the host regulator 106 from 3.3 V to 1.8 V. It is thereby possible to match the interfaces.

Here, during a normal sequence, the clock line 132, the command line 133, and the data line 134 as interfaces are all set to a ground potential and, thereafter, the output voltage of the host regulator 106 of the host device 102 is changed and the output voltage of the card regulator 121 of the memory card 103 is changed. Nevertheless, if a mismatch of the interfaces is already ascertained at determination processing S620, the host control unit 104 of the host device 102 executes processing S621, which is the recovery processing, for promptly matching the interfaces without performing the sequence including the foregoing procedures.

Subsequently, at determination processing S622, the host control unit 104 of the host device 102 determines the supply voltage to the host IO driver 108 and the supply voltage to the card 10 driver 123. If it is determined that the supply voltage to the host IO driver 108 is 1.8 V and the supply voltage to the card IO driver 123 is 3.3 V, the routine proceeds to processing S623, and otherwise proceeds to determination processing S603.

If the supply voltage to the host IO driver 108 is 1.8 V and the supply voltage to the card IO driver 123 is 3.3 V, at processing 5623, the host control unit 104 of the host device 102 performs the recovery of the IO voltage. Specifically, the host control unit 104 controls the host regulator 106 and switches the output voltage of the host regulator 106 from 1.8 V to 3.3 V, and returns the output voltage to 3.3 V. It is thereby possible to match the interfaces.

As described above, the host control unit 104 of the host device 102 changes the state of the information processing system 101 to a state where the level of the data line 134 does not change and maintains such state, detects the voltage level that is supplied to the card IO driver 123 of the memory card 103 in the foregoing state with the host voltage detection circuit 109, determines a mismatch of the interfaces based on determination processing S620 and determination processing S622, and performs the recovery processing of matching the interface voltages by causing the voltage of the host IO driver 108 of the host device 102 to be identical to the voltage of the card IO driver 123 of the memory card 103 based on processing S621 and processing 5623. Consequently, with this embodiment, is it possible to avoid a mismatch of the interface voltages between the host device 102 and the memory card 103.

Moreover, after the host control unit 104 of the host device 102 confirms that the voltage of the data line 134 and the output voltage of the host regulator 106 are the same based on the foregoing processing, it is possible to read the data stored in the memory card 103 in a nonvolatile manner. Accordingly, with this embodiment, normal reading operations can be performed in a state of avoiding a mismatch of the interface voltages between the host device 102 and the memory card 103.

Note that, although the host device 102 performed the recovery processing upon an interface mismatch in the foregoing explanation, the present invention is not limited to the foregoing example, and the memory card 103 may also perform the recovery processing upon an interface mismatch. Note that, although the card regulator 121 does not have the function of changing the output voltage of 1.8 V to 3.3 V in the foregoing explanation, in the ensuing explanation, a card regulator with the function of changing the output voltage of 1.8 V to 3.3 V is used as the card regulator 121.

For example, in substitute for determination processing S620, the card voltage detection circuit 124 of the memory card 103 detects whether the voltage of the command line 133 is higher than 1.8 V when the output voltage of the card regulator 121 is 1.8 V, and the card control unit 120 thereby determines the supply voltage to the host IO driver 108 and the supply voltage to the card IO driver 123.

If it is determined that the supply voltage to the host IO driver 108 is 3.3 V and the supply voltage to the card IO driver 123 is 1.8 V, the card control unit 120 changes the IO voltage in substitute for processing S621. Specifically, the card control unit 120 controls the card regulator 121 and switches the output voltage of the card regulator 121 from 1.8 V to 3.3 V. It is thereby possible to match the interface voltages.

Moreover, in substitute for the foregoing processing, the card control unit 120 may also prohibit the reading and writing of data from the host device 102 to the memory card 103 when the output voltage of the card regulator 121 is 1.8 V and the card voltage detection circuit 124 detects that the voltage of the command line 133 is higher than 1.8 V. In the foregoing case, it is possible to avoid failures of the information processing system caused by a mismatch of the interface voltages, and additionally notify the host device 102 that a mismatch of the interface voltages has occurred.

Moreover, in substitute for determination processing S622, the card voltage detection circuit 124 of the memory card 103 detects whether the voltage of the command line 133 is lower than 3.3 V when the output voltage of the card regulator 121 is 3.3 V, and the card control unit 120 thereby determines the supply voltage to the host IO driver 108 and the supply voltage to the card IO driver 123.

If it is determined that the supply voltage to the host IO driver 108 is 1.8 V and the supply voltage to the card IO driver 123 is 3.3 V, the card control unit 120 changes the IO voltage in substitute for processing S623. Specifically, the card control unit 120 controls the card regulator 121 and switches the output voltage of the card regulator 121 from 3.3 V to 1.8 V. It is thereby possible to match the interface voltages.

Moreover, in substitute for the foregoing processing, the card control unit 120 may also prohibit the reading and writing of data from the host device 102 to the memory card 103 when the output voltage of the card regulator 121 is 3.3 V and the card voltage detection circuit 124 detects that the voltage of the command line 133 is lower than 3.3 V. In the foregoing case also, it is possible to avoid failures of the information processing system caused by a mismatch of the interface voltages, and additionally notify the host device 102 that a mismatch of the interface voltages has occurred.

(Second Embodiment)

Figure 12:
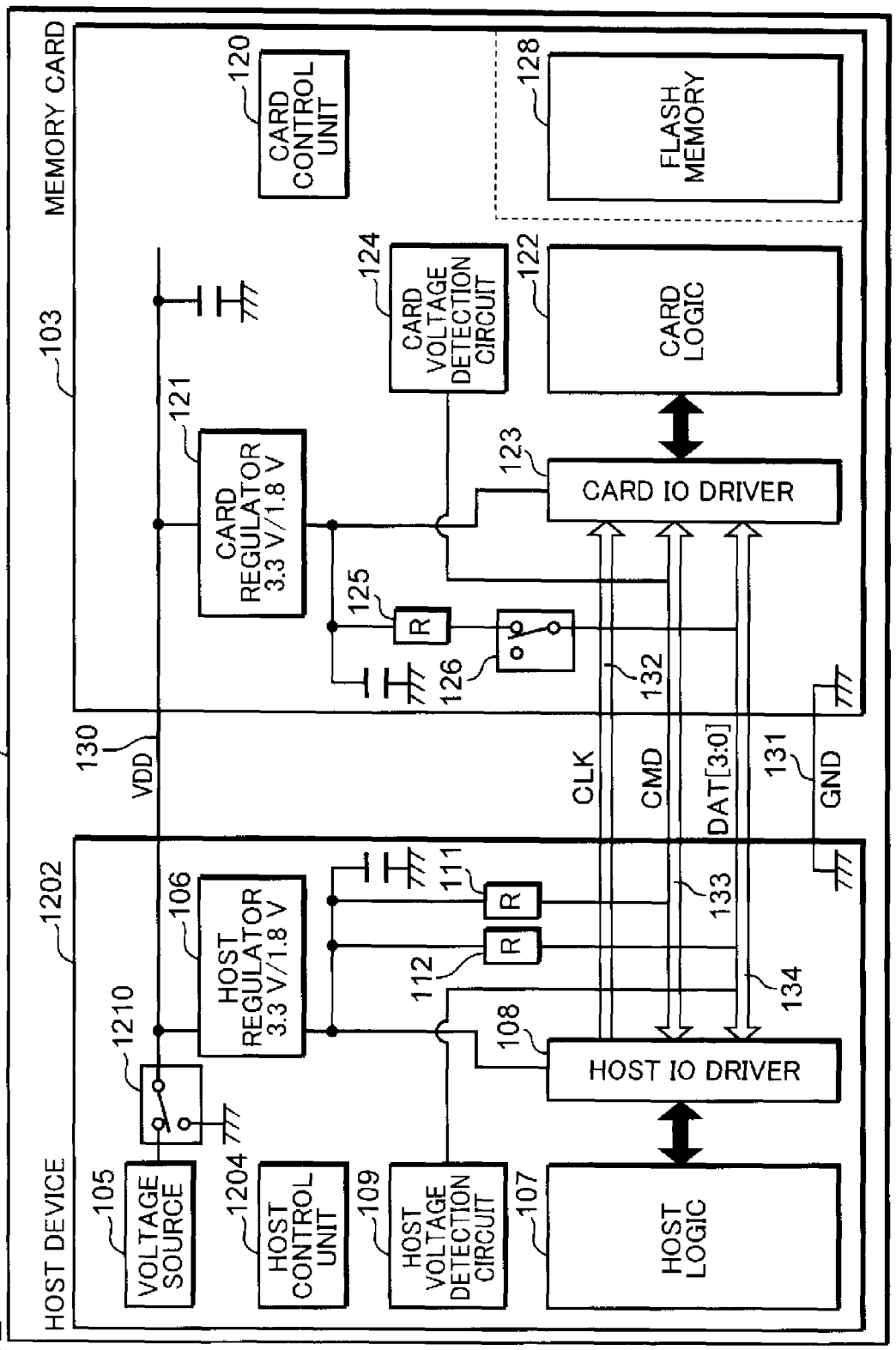
FIG. 12 is a diagram showing the configuration of the information processing system according to the second embodiment of the present invention.

The information processing apparatus according to the second embodiment of the present invention is now explained with reference to the drawings. FIG. 12 is a diagram showing the configuration of the information processing system according to the second embodiment of the present invention. Components in the configuration of the information processing system of this embodiment which are the same as those of the first embodiment are given the same reference numeral, and the explanation thereof is omitted.

The second embodiment realizes the recovery processing with a method that is different from the first embodiment. Specifically, the information processing system shown in FIG. 12 differs from the information processing system shown in FIG. 1 in that the host voltage switch 110 is replaced with a host voltage switch 1210. The host voltage switch 1210 has a function of connecting the voltage line 130 to the voltage source 105 or a ground potential, and causing the potential of the voltage line 130 to short-circuit with the ground potential.

As described above, since the host voltage switch 1210 differs from the first embodiment and the internal control of the host device is different, the host control unit, the host device, and the information processing system are also given new reference numerals and indicated as the host control unit 1204, the host device 1202, and the information processing system 1201.

Figure 13:
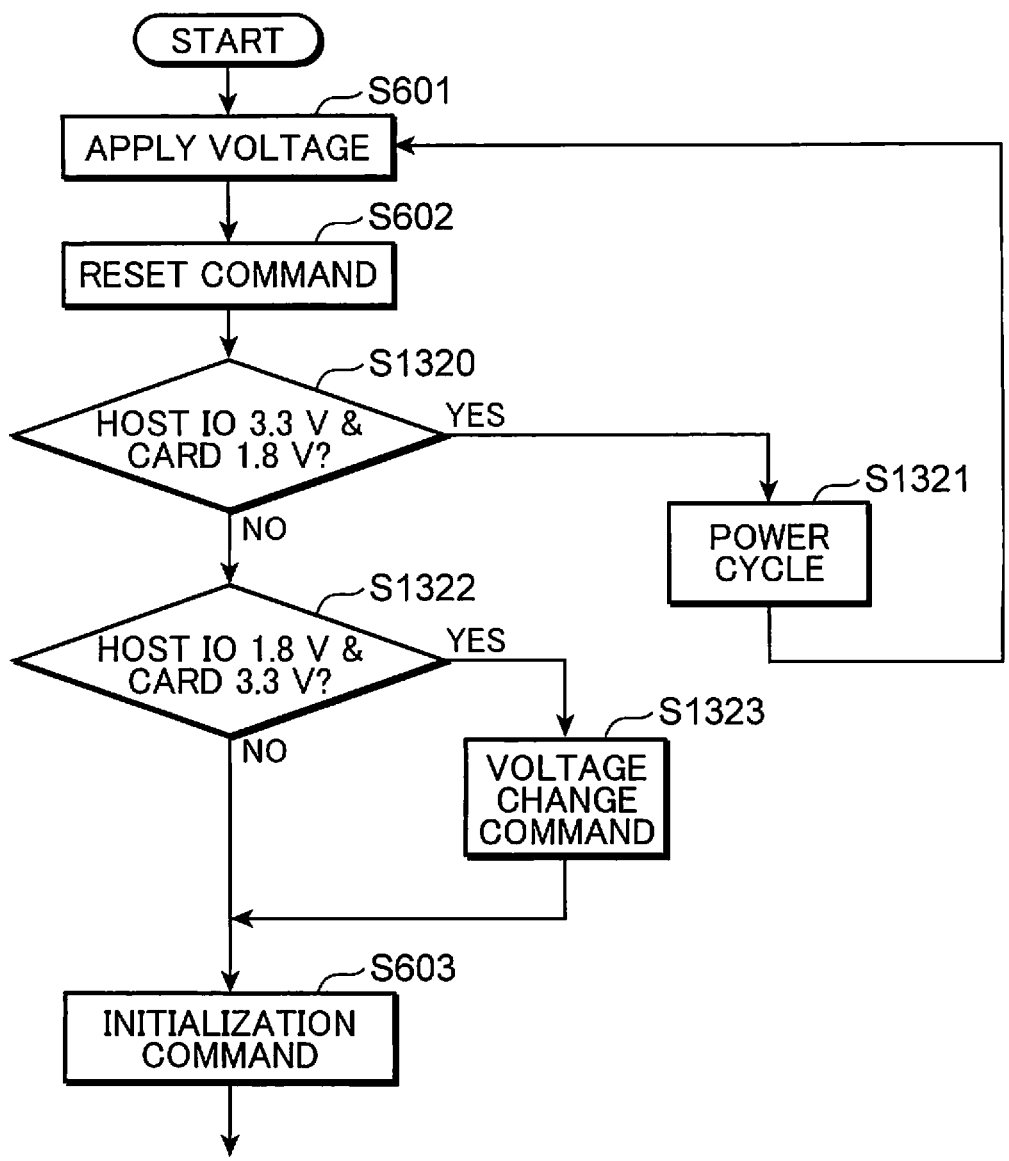
FIG. 13 is a flowchart explaining a part of the control processing of the information processing system according to the second embodiment of the present invention.

FIG. 13 is a flowchart explaining a part of the control processing for the host device 1202 to control the memory card 103. However, since the control processing of this embodiment differs from the control processing of the first embodiment shown in FIG. 6 in that it is the processing between processing S602 and processing S603 in the recovery processing that is performed after a mismatch of the interface voltages is detected, FIG. 13 only shows the processing between processing S602 and processing S603. The other processing is the same as FIG. 6.

After processing S602 is executed, at determination processing S1320, the host control unit 1204 of the host device 1202 determines the supply voltage to the host IO driver 108 and the supply voltage to the card IO driver 123. If it is determined that the supply voltage to the host IO driver 108 is 3.3 V and the supply voltage to the card IO driver 123 is 1.8 V, the routine proceeds to processing S1321, and otherwise proceeds to determination processing S1322.

If the supply voltage to the host IO driver 108 is 3.3 V and the supply voltage to the card IO driver 123 is 1.8 V, at processing S1321, the host control unit 1204 of the host device 1202 performs processing for cycling the power. Specifically, the host control unit 1204 switches the host voltage switch 1210 and causes the voltage of the voltage line 130 to short-circuit with the ground potential. The host control unit 1204 thereafter waits a given period of time and returns the host voltage switch 1210 to its original state, and connects the voltage source 105 and the voltage line 130. It is thereby possible to reliably set the voltage (potential) of the voltage line 130 connected to the memory card 103 to 0 V. Since the card control unit 120 of the memory card 103 thereafter sets the output voltage of the card regulator 121 after the power has been cycled to 3.3 V, it is possible to match the interface voltages.

Figure 14:
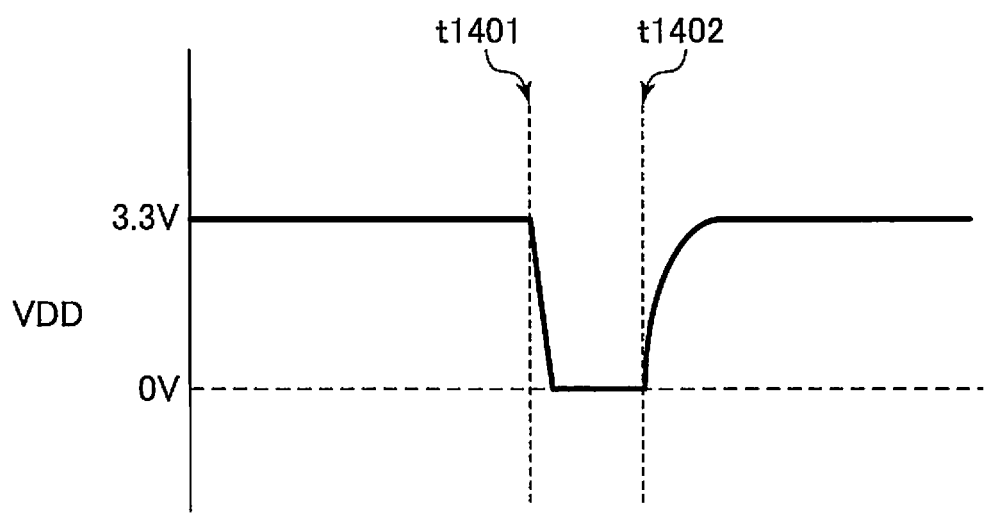
FIG. 14 is a diagram showing an example of the voltage change of the voltage line upon cycling the power.

FIG. 14 is a diagram showing an example of the voltage change of the voltage line 130 upon cycling the power at processing S1321. In the example shown in FIG. 14, at the timing of time t1401, the host control unit 1204 switches the host voltage switch 1210 and short-circuits the voltage line 130 with the ground potential, and the voltage of the voltage line 130 thereby drops sharply. At time t1402 after waiting a given period of time, the host control unit 1204 returns the host voltage switch 1210 to its original state and connects the voltage source 105 and the voltage line 130, and the voltage of the voltage line 130 is thereby restored. As a result of cycling the power, since the card control unit 120 can change the output voltage of the card regulator 121 to 3.3 V, it is possible to match the interface voltages.

Returning to FIG. 13 once again, at determination processing S1322, the host control unit 1204 of the host device 1202 determines the supply voltage to the host IO driver 108 and the supply voltage to the card IO driver 123. If it is determined that the supply voltage to the host IO driver 108 is 1.8 V and the supply voltage to the card IO driver 123 is 3.3 V, the routine proceeds to processing S1323, and otherwise proceeds to processing S603.

If the supply voltage to the host IO driver 108 is 1.8 V and the supply voltage to the card IO driver 123 is 3.3 V, at processing S1323, the host control unit 1204 of the host device 1202 issues a "voltage change command" to the memory card 103. Based on the "voltage change command," since the card control unit 120 of the memory card 103 sets the output voltage of the card regulator 121 to 1.8 V, it is possible to match the interface voltages. As described above, if the output voltage of the host regulator 106 is 1.8 V and the host voltage detection circuit 109 detects that the voltage of the data line 134 is higher than 1.8 V, the host device 1202 controls the memory card 103 and switches the drive voltage of the memory card 103 from 3.3 V to 1.8 V.

Figure 15:
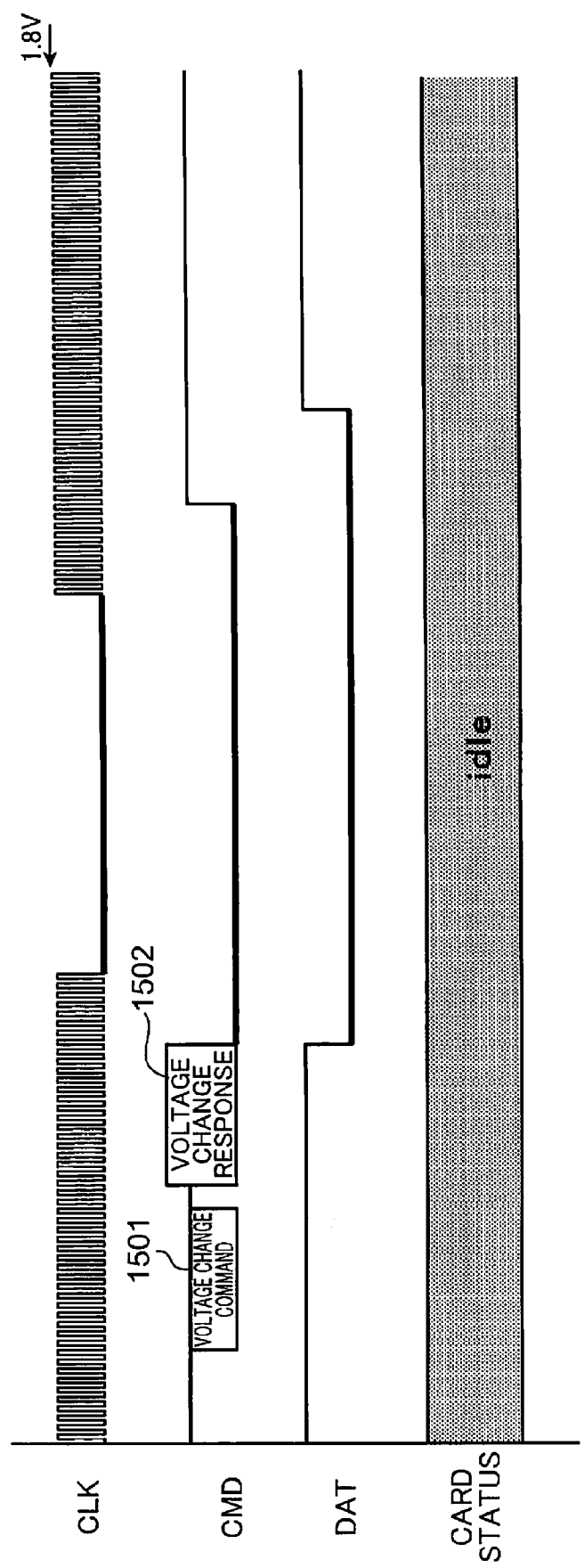
FIG. 15 is a timing chart explaining an example of the voltage change processing for changing the interface voltage.

FIG. 15 is a timing chart explaining an example of the voltage change processing for changing the interface voltage based on processing S1323. FIG. 15 shows, in order from the top, the signal CLK of the clock line 132, the operation CMD of the command line 133, the operation DAT of the data line 134, and the internal status of the memory card 103.

In the example shown in FIG. 15, since the voltage is changed in a state where a mismatch of the interface voltages has occurred, the voltage change processing of FIG. 15 differs from the voltage change processing of FIG. 7 with respect to the voltage level of the respective signals, and that the internal status of the memory card 103 is "idle." Specifically, since the clock line 132 is driven by the host device 1202, the clock signal CLK has an amplitude of 1.8 V, and, since the "voltage change command" 1501 is also driven by the host device 1202, the "voltage change command" 1501 also has an amplitude of 1.8 V. However, since the "voltage change response" 1502 is driven by the memory card 103, the amplitude of the "voltage change response" 1502 is an amplitude of 3.3 V. Based on the "voltage change command" 1501, since the card control unit 120 can change the output voltage of the card regulator 121 to 1.8 V, it is possible to match the interface voltages.

As described above, the host control unit 1204 of the host device 1202 determines a mismatch of the interface voltages based on determination processing S1320 and determination processing S1322, and, in the memory card 103, the recovery processing of changing the voltage of the card IO driver 123 to the voltage of the host IO driver 108 of the host device 102 and matching the interface voltages is performed based on processing S1321 and processing S1323. Consequently, with this embodiment, it is possible to avoid a mismatch of the interface voltages between the host device 1202 and the memory card 103.

(Third Embodiment)

The information processing system according to the third embodiment of the present invention is now explained. The configuration of the information processing system of this embodiment may be the same as the first embodiment or be the same as the second embodiment. Thus, the information processing system of the third embodiment is explained with reference to FIG. 1 in substitute for indicating a new diagram.

The new function that is added to the third embodiment is for the memory card 103 to output the status of the card regulator 121. In addition, the processing for recognizing a mismatch of the interface voltages in the first embodiment is replaced.

Figure 16:
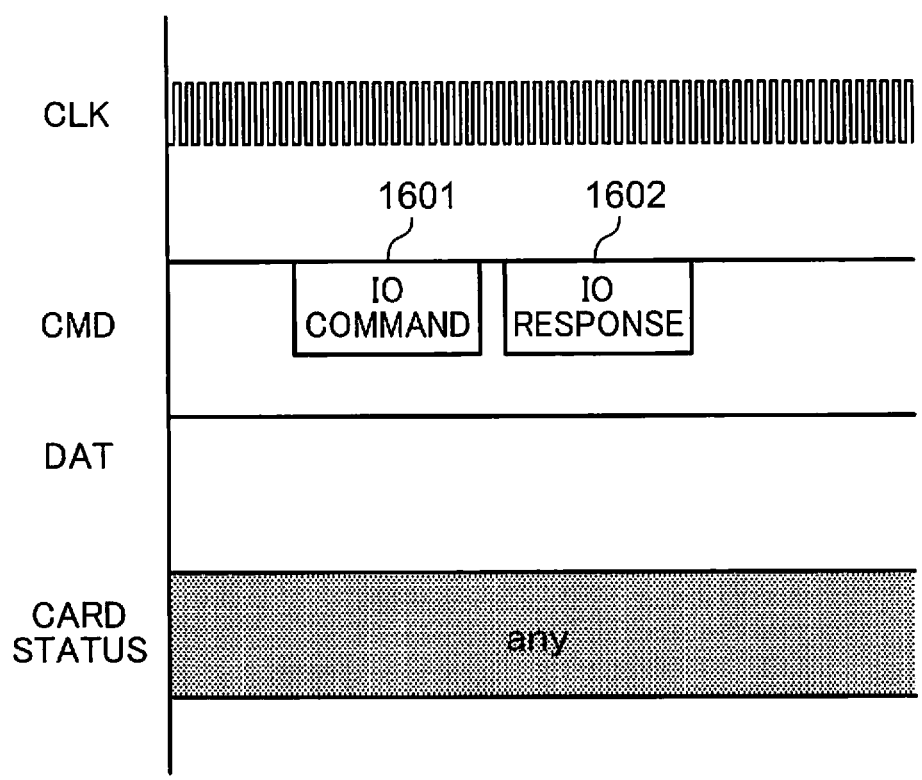
FIG. 16 is a timing chart upon the host device issuing an "IO command" to the memory card in the information processing system according to the third embodiment of the present invention.

FIG. 16 is a timing chart upon the host device 102 issuing an "IO command" to the memory card 103 in the information processing system according to the third embodiment of the present invention. FIG. 16 shows, in order from the top, the signal CLK of the clock line 132, the operation CMD of the command line 133, the operation DAT of the data line 134, and the internal status of the memory card 103.

Foremost, the host device 102 issues an "IO command" 1601 to the memory card 103. In response, the memory card 103 returns an "IO response" 1602 storing information concerning the status of the card regulator 121; for example, information concerning the output voltage of the card regulator 121. The host device 102 can know the output voltage of the card regulator 121 as the status of the card regulator 121 by confirming the "IO response" 1602. Accordingly, the host device 102 can recognize a mismatch of the interface voltages at an arbitrary timing as needed.

Specifically, the host device 102 can recognize a mismatch of the interface voltages by issuing an "IO command" to the memory card 103, for example, immediately after the reset command of processing S602 is issued or before the read command of processing S610 is issued in the flowchart of FIG. 6. Moreover, since the recovery processing after recognizing a mismatch of the interface voltages is the same as the recovery processing explained in the first embodiment and the second embodiment, the explanation thereof is omitted.

Note that, although this embodiment explained a case where the memory card 103 has a function of outputting the status of the card regulator 121 in the "IO response," the present invention is not limited to this method, and the method may be variously modified so as long as the memory card 103 has a function of outputting the status of the card regulator 121. For example, such information may also be stored in the "busy response" or the "ready response" of the "initialization command."

Moreover, although this embodiment was explained using FIG. 1 showing the configuration of the first embodiment this embodiment, since it is not necessary to detect the voltage of the command line 133 and the data line 134 in this embodiment, the card voltage detection circuit 124 and the host voltage detection circuit 109 may be omitted.

(Fourth Embodiment)

Figure 17:
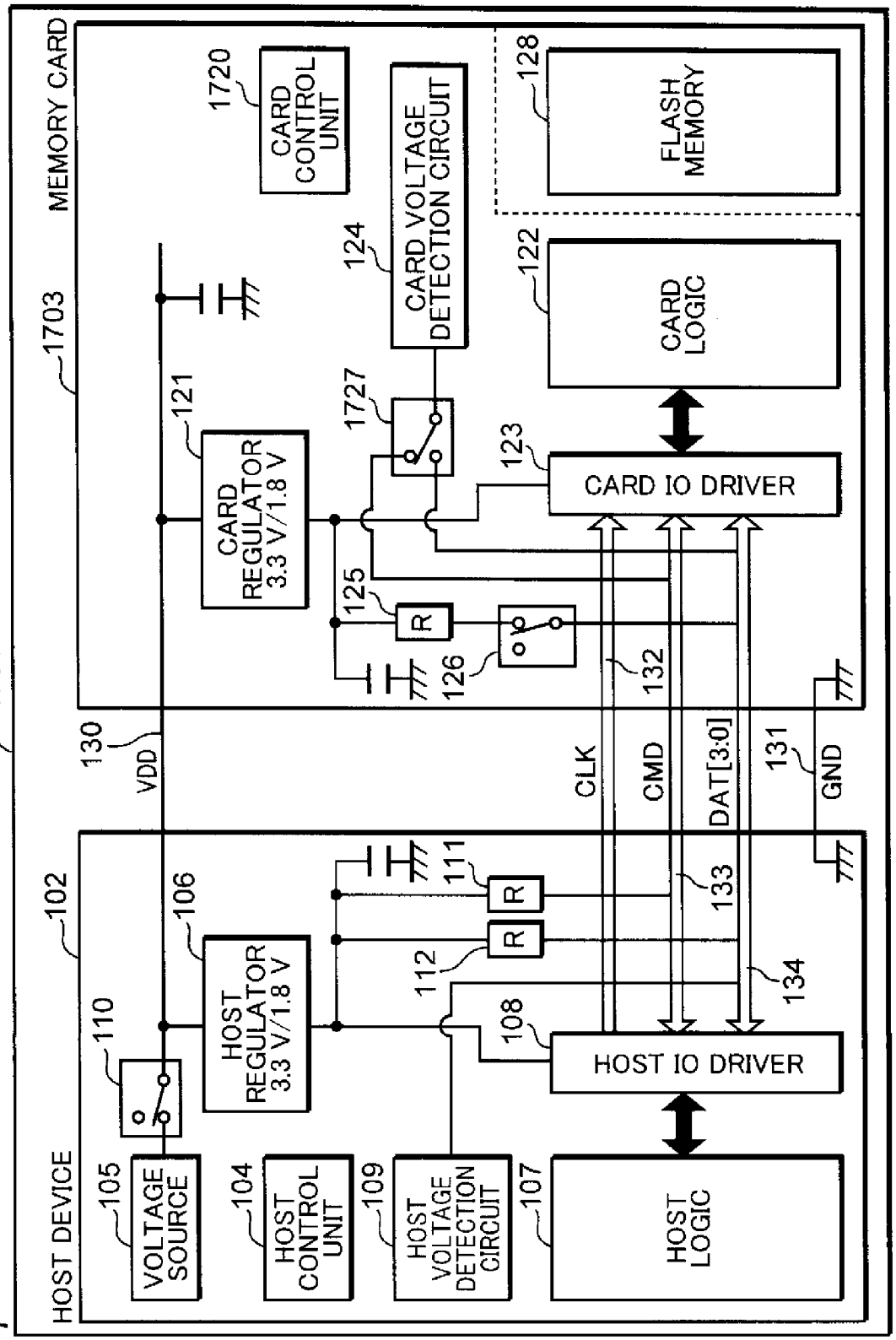
FIG. 17 is a diagram showing the configuration of the information processing system according to the fourth embodiment of the present invention.

The information processing system according to the fourth embodiment of the present invention is now explained with reference to the drawings. FIG. 17 is a diagram showing the configuration of the information processing system according to the fourth embodiment of the present invention. Components in the configuration of the information processing system of the fourth embodiment which are the same as those of the first embodiment are given the same reference numeral, and the explanation thereof is omitted. The fourth embodiment realizes a scheme of enabling the host device 102 to more easily detect an interface mismatch by the memory card 1703 detecting a mismatch of the interface voltages and changing the status of the memory card 1703.

The information processing system shown in FIG. 17 differs from the information processing system shown in FIG. 1 in that a card voltage detection switch 1727 has been added. The card voltage detection switch 1727 has a function of switching the connection destination of the card voltage detection circuit 124 between the command line 133 and the data line 134. Since the card voltage detection switch 1727 is added to the first embodiment as described above, the card control unit, the memory card, and the information processing system are also given new reference numerals and indicated as the card control unit 1720, the memory card 1703, and the information processing system 1701.

The card voltage detection circuit 124 of the memory card 1703 needs to detect the voltage (potential) of the command line 133 at the timing from time t706 after the "voltage change command" has been issued to time t707 in the timing chart of FIG. 7 as explained in the first embodiment. Accordingly, the card control unit 1720 controls the card voltage detection switch 1727 and connects the card voltage detection circuit 124 and the command line 133 at least during the period from time t706 to time t707.

Figure 18:
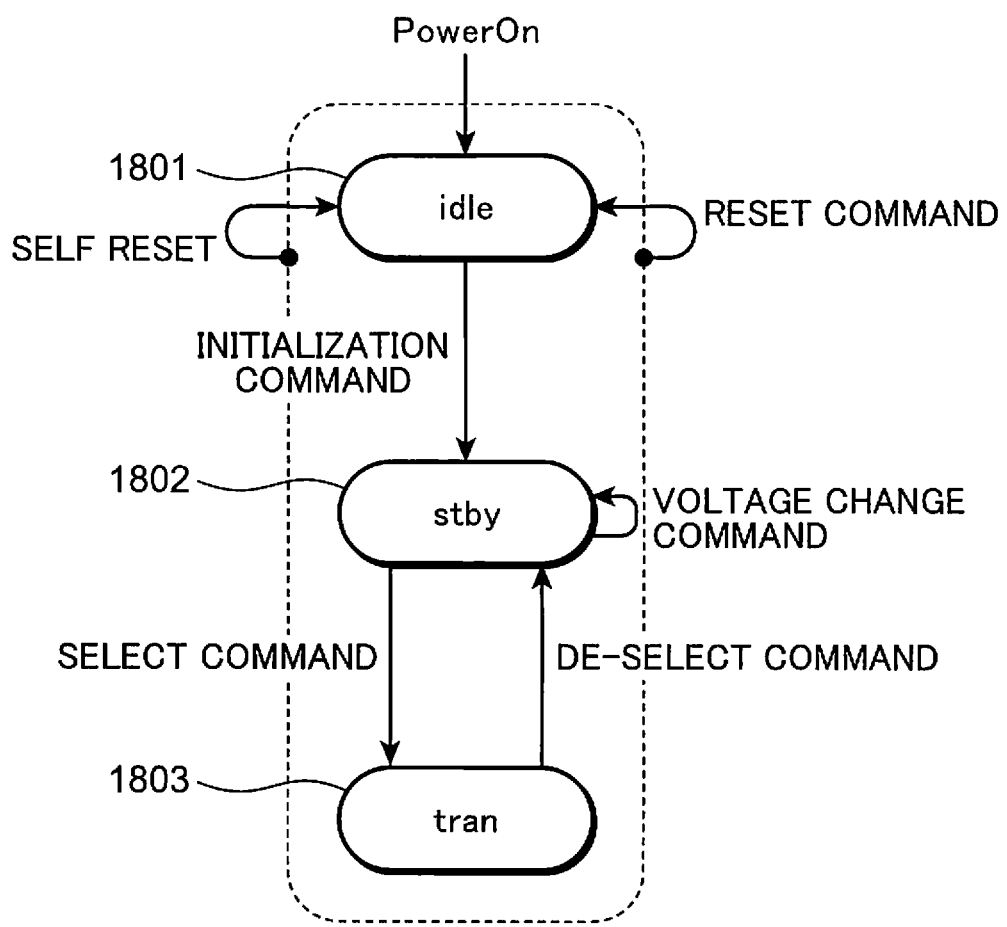
FIG. 18 is a transition diagram of the internal status of the nonvolatile storage device according to the fourth embodiment of the present invention.

FIG. 18 is a transition diagram of the internal status of the memory card 1703. The transition diagram of FIG. 18 differs from the transition diagram of FIG. 2 in that the change from an arbitrary status to "idle" 1801 based on "self reset" has been added.

As explained in the first embodiment, the data line 134 is pulled up to a high level by the host data pull-up resistor 112 during the period that the "initialization command" of FIG. 3 is being processed and during the period after the "read command" of FIG. 8 in which the card control unit 1720 is preparing the read data to be output to the host device 102.

As described above, during the period that the data line 134 is pulled up to a high level by the host data pull-up resistor 112, the card voltage detection circuit 124 of the memory card 1703 can detect the voltage (potential) of the data line 134 and detect a mismatch of the interface voltages.

Specifically, when an "initialization command" is issued from the host device 102, the card control unit 1720 switches the card voltage detection switch 1727 so as to connect the card voltage detection circuit 124 and the data line 134. Moreover, at the stage when the internal initialization operation of the memory card 1703 is complete, if the drive voltage of the host IO driver 108 and the drive voltage of the card IO driver 123 in the memory card 1703 obtained from the detection result of the card voltage detection circuit 124 are the same, the card control unit 1720 of the memory card 1703 changes the status of the memory card 1703 to "stby" 1802 and returns a "ready response" to the host device 102. Meanwhile, if the drive voltages are different, the card control unit 1720 of the memory card 1703 changes the status to "idle" 1801 based on "self reset" and leaves the status of the memory card 1703 as "idle" 1801 without change, and does not return a "ready response" to the host device 102.

Moreover, with a different control method, the card control unit 1720 switches the card voltage detection switch 1727 so as to connect the card voltage detection circuit 124 and the data line 134 when a "read command" is issued from the host device 102. Subsequently, at the stage when the preparation of the read data to be output to the host device 102 is complete in the memory card 1703, if the drive voltage of the host IO driver 108 and the drive voltage of the card IO driver 123 in the memory card 1703 obtained from the detection result of the card voltage detection circuit 124 are the same, the card control unit 1720 of the memory card 1703 outputs the read data 803 to the host device 102 via the data line 134 in synch with the clock of the clock line 132. Meanwhile, if the drive voltages are different, the card control unit 1720 of the memory card 1703 changes the status of the memory card 1703 to "idle" 1801 based on "self reset" and does not output data to the host device 102.

As described above, as a result of creating a scheme where the memory card 1703 does not operate normally when it detects a mismatch of the interface voltages, the host device 102 is able to notice an interface mismatch.

Note that the period that the card voltage detection circuit 124 detects the voltage of the data line 134 and the period that the card control unit 1720 detects a mismatch of the interface voltages are not limited to the periods explained above so as long as it is a timing that includes a period where they are pulled up to a high level by the host data pull-up resistor 112. For example, it may also be a period after the transfer of the write data upon the host device 102 writing data into the memory card 1703.

Figure 19:
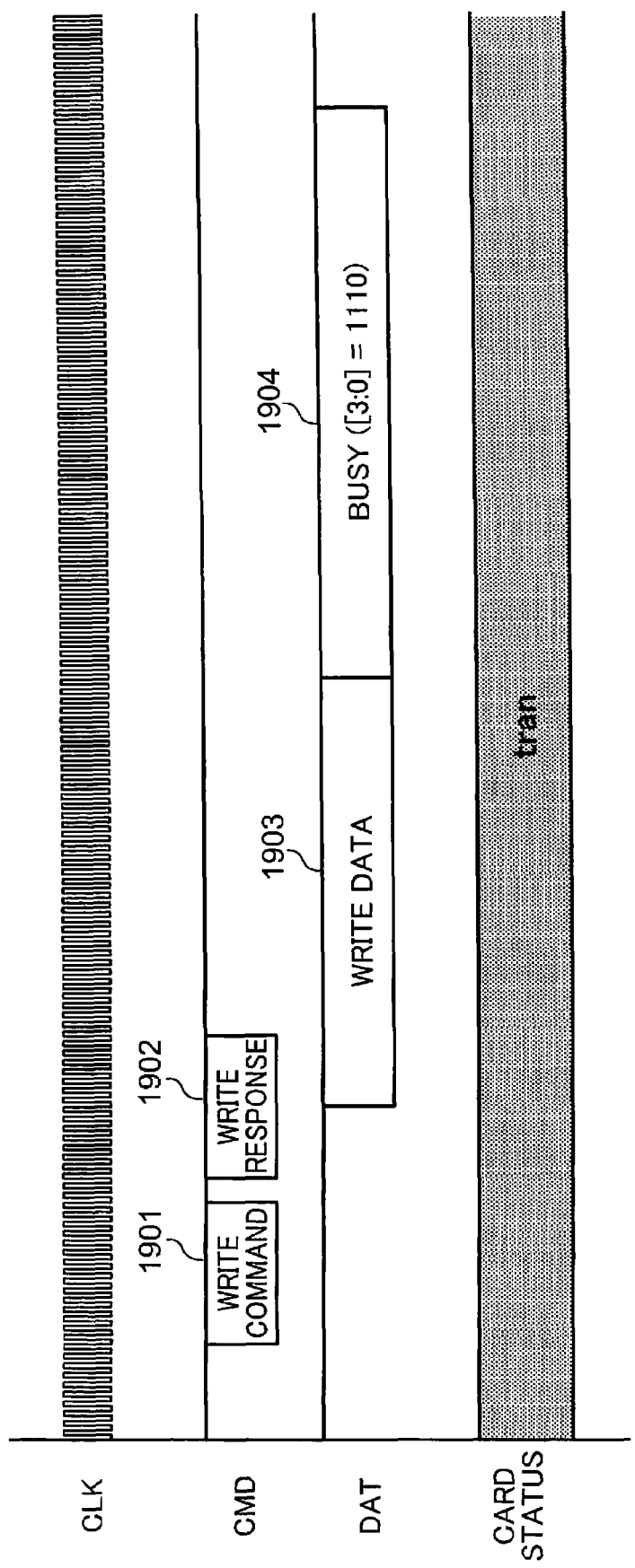
FIG. 19 is a timing chart upon the internal write processing of the nonvolatile storage device according to the fourth embodiment of the present invention.
Figure 20:
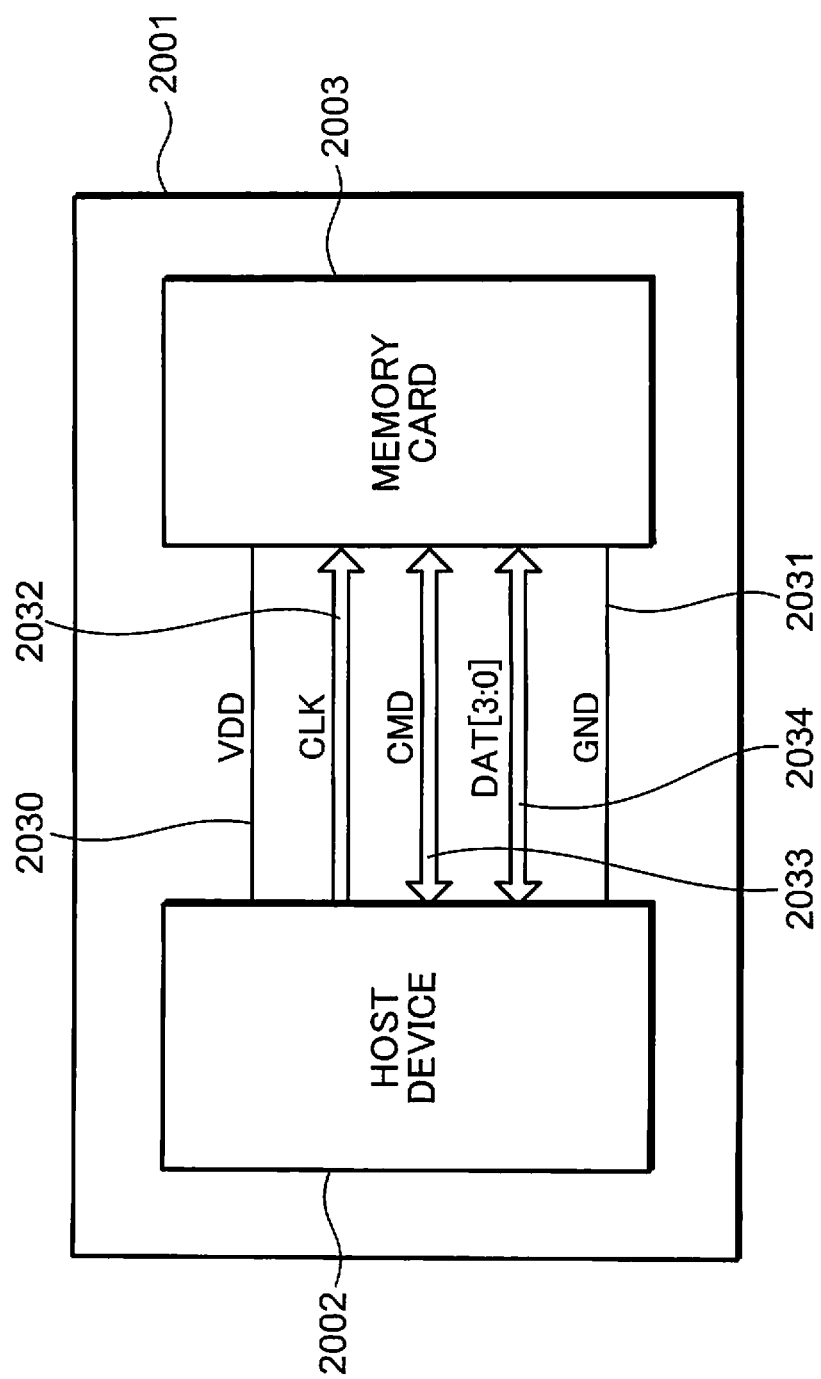
FIG. 20 is a diagram showing the configuration of a conventional information processing system.
Figure 21:
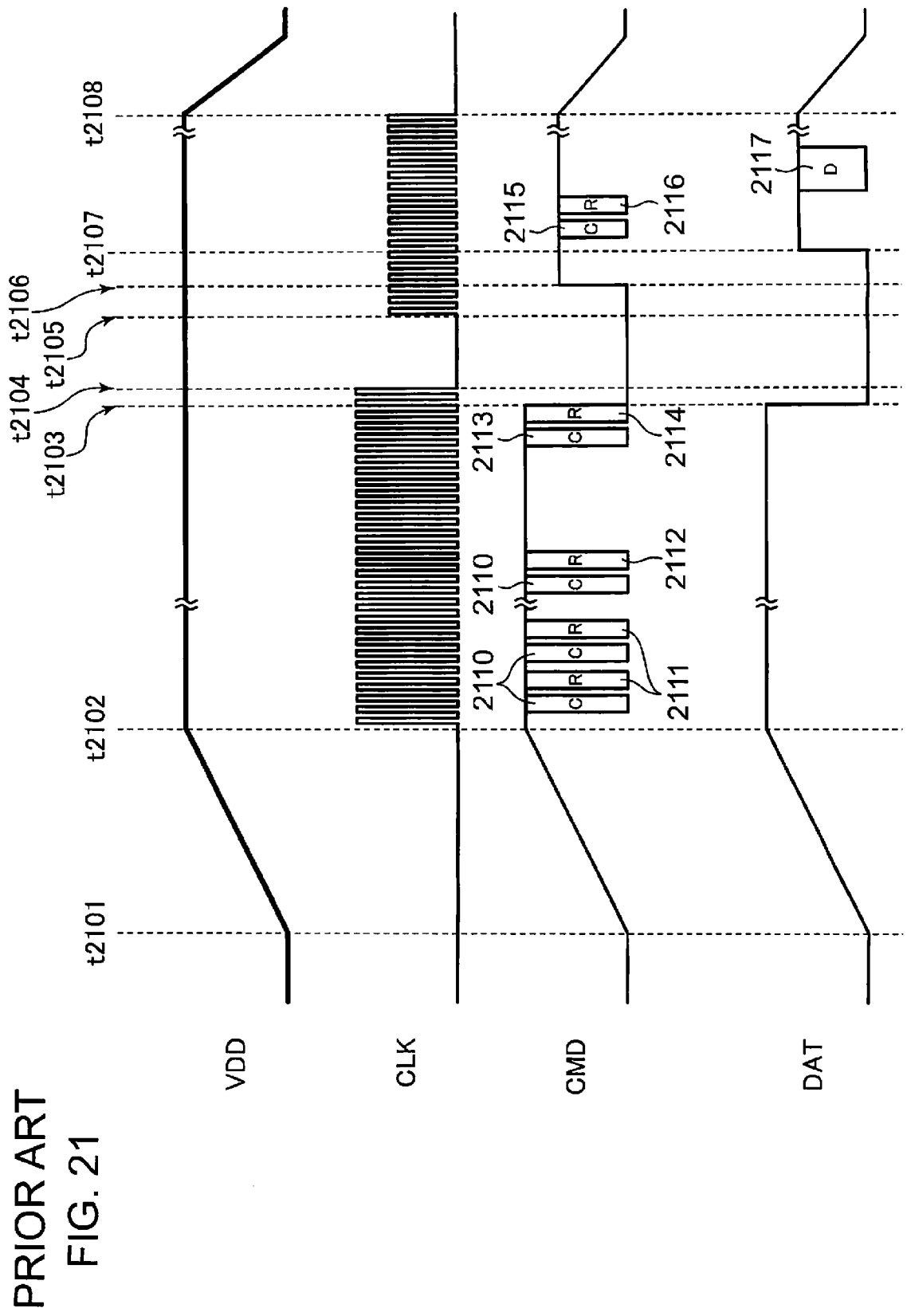
FIG. 21 is a timing chart of the internal interface of a conventional information processing system.

FIG. 19 is a timing chart of the data write processing upon the host device 102 issuing a "write command" to the memory card 1703. FIG. 19 shows, in order from the top, the signal CLK of the clock line 132, the operation CMD of the command line 133, the operation DAT of the data line 134, and the internal status of the memory card 103.

When a "write command" 1901 is issued from the host device 102 via the command line 133 with the memory card 1703 in the "tran" status, the memory card 1703 returns a "write response" 1902 to the host device 102 via the command line 133. After the host device 102 receives the "write response" 1902, it transfers the "write data" 1903 via the data line 134 in synch with the clock of the clock line 132, and the data line 134 becomes "busy" 1904. As described above, the card voltage detection circuit 124 may detect the voltage of the data line 134 and the card control unit 1720 may detect a mismatch of the interface voltages during the period after the write data is transferred upon the host device 102 writing data into the memory card 1703.

Although the present invention was explained based on each of the foregoing embodiments, it goes without saying that the present invention is not limited to the foregoing embodiments. Moreover, each of the foregoing embodiments can be variously modified to the extent that it does not deviate from the gist of the present invention, and the respective embodiments may also be combined.

The following is a summary of the present invention based on each of the embodiments described above. Specifically, the information processing apparatus according to the present invention is an information processing apparatus connected to a nonvolatile storage device via a voltage line for supplying a power source to the nonvolatile storage device, a clock line for supplying a clock signal to the nonvolatile storage device, and one or more data lines at least one of which is pulled up by the nonvolatile storage device and which are used for bidirectionally communicating data signals with the nonvolatile storage device, comprising a voltage switch, a voltage source which is connected to the voltage line via the voltage switch and which supplies a predetermined first voltage to the voltage line, a regulator which is connected to the voltage line and which outputs the first voltage or a second voltage that is lower than the first voltage when the first voltage is applied, an input/output driver for driving the clock line and the data line with the output of the regulator as a power source, a voltage detection circuit for detecting whether a voltage of the data line is the second voltage, or a voltage that is higher than the second voltage, and a control unit for detecting whether a drive voltage of the information processing apparatus and a drive voltage of the nonvolatile storage device are different based on an output voltage of the regulator and a detection result of the voltage detection circuit.

In this information processing apparatus, since whether the voltage of the data line is the second voltage that is lower than the first voltage or a voltage that is higher than the second voltage is detected, and whether the drive voltage of the information processing apparatus and the drive voltage of the nonvolatile storage are different is detected based on the foregoing detection result and the output voltage of the regulator in the information processing apparatus, it is possible to detect a mismatch of the interface voltages between the information processing apparatus and the nonvolatile storage device, and thereby avoid factors that cause system failures.

Preferably, the voltage detection circuit detects the voltage of the data line after the information processing apparatus applies a voltage to the nonvolatile storage device and before the information processing apparatus reads data stored in the nonvolatile storage device in a nonvolatile manner.

In the foregoing case, since the voltage of the data line is detected after the information processing apparatus applies a voltage to the nonvolatile storage device and before the information processing apparatus reads data stored in the nonvolatile storage device in a nonvolatile manner, it is possible to detect the voltage of the data line in a state where the data line is maintaining the "H" level, and accurately detect the drive voltage of the nonvolatile storage device.

Preferably, the control unit controls the pull-up or non-pull-up of the data line in the nonvolatile storage device.

In the foregoing case, since the data line can be pulled up in the nonvolatile storage device, it is possible to realize a state where the data line maintains the "H" level in the nonvolatile storage device.

Preferably, the data line is pulled up inside the information processing apparatus.

In the foregoing case, since the data line is pulled up in the information processing apparatus, it is possible to prevent the voltage of the data line from becoming a midpoint potential, and more accurately detect the drive voltage of the nonvolatile storage device.

Preferably, the information processing apparatus controls the pull-up or non-pull-up of the data line in the nonvolatile storage device.

In the foregoing case, since it is possible to realize a state where the data line is not pulled up in the information processing apparatus upon detecting the drive voltage of the nonvolatile storage device, the drive voltage of the nonvolatile storage device becomes the voltage of the data line without any change, and the drive voltage of the nonvolatile storage device can be detected easily.

Preferably, the voltage detection circuit detects whether the voltage of the data line is lower than the first voltage when the output voltage of the regulator is the first voltage.

In the foregoing case, since whether the voltage of the data line is lower than the first voltage is detected when the output voltage of the regulator is the first voltage, the information processing apparatus can detect that the drive voltage of the nonvolatile storage device is lower than the drive voltage of the information processing apparatus.

Preferably, when the output voltage of the regulator is the first voltage and the voltage detection circuit detects that the voltage of the data line is lower than the first voltage, the control unit switches the output of the regulator from the first voltage to the second voltage.

In the foregoing case, since the output of the regulator is switched from the first voltage to the second voltage when the output voltage of the regulator is the first voltage and the voltage of the data line is lower than the first voltage, it is possible to perform recovery processing of resolving the mismatch of the interface voltages between the information processing apparatus and the nonvolatile storage device by lowering the drive voltage of the information processing apparatus so as to be identical to the drive voltage of the nonvolatile storage device. Since it is thereby possible to match the interface voltages between the information processing apparatus and the nonvolatile storage device, the information processing apparatus and the nonvolatile storage device can operate normally.

Preferably, the voltage detection circuit detects whether the voltage of the data line is higher than the second voltage when the output voltage of the regulator is the second voltage.

In the foregoing case, since whether the voltage of the data line is higher than the second voltage is detected when the output voltage of the regulator is the second voltage, the information processing apparatus can detect that the drive voltage of the nonvolatile storage device is higher than the drive voltage of the information processing apparatus.

Preferably, when the output voltage of the regulator is the second voltage and the voltage detection circuit detects that the voltage of the data line is higher than the second voltage, the control unit switches the output of the regulator from the second voltage to the first voltage.

In the foregoing case, since the output of the regulator is switched from the second voltage to the first voltage when the output voltage of the regulator is the second voltage and the voltage of the data line is higher than the second voltage, it is possible to perform recovery processing of resolving the mismatch of the interface voltages between the information processing apparatus and the nonvolatile storage device by raising the drive voltage of the information processing apparatus so as to be identical to the drive voltage of the nonvolatile storage device. Since it is thereby possible to match the interface voltages between the information processing apparatus and the nonvolatile storage device, the information processing apparatus and the nonvolatile storage device can operate normally.

Preferably, when the output voltage of the regulator is the second voltage and the voltage detection circuit detects that the voltage of the data line is higher than the second voltage, the information processing apparatus controls the nonvolatile storage device to switch the drive voltage of the nonvolatile storage device from the first voltage to the second voltage.

In the foregoing case, since the information processing apparatus controls the nonvolatile storage device to switch the drive voltage of the nonvolatile storage device from the first voltage to the second voltage when the output voltage of the regulator is the second voltage and the voltage of the data line is higher than the second voltage, it is possible to perform recovery processing of resolving the mismatch of the interface voltages between the information processing apparatus and the nonvolatile storage device by lowering the drive voltage of the nonvolatile storage device so as to be identical to the drive voltage of the information processing apparatus. Since it is thereby possible to match the interface voltages between the information processing apparatus and the nonvolatile storage device, the information processing apparatus and the nonvolatile storage device can operate normally.

Preferably, the voltage switch is configured to be able to switch the connection with the voltage line to the voltage source or a ground line.

In the foregoing case, since the connection with the voltage line can be switched to the voltage source or the ground line, the voltage of the voltage line can be reliably set to 0 V when the information processing apparatus performs processing for cycling the power, and the recovery processing of resolving the mismatch of the interface voltages between the information processing apparatus and the nonvolatile storage device can be reliably performed.

Preferably, when the output voltage of the regulator is the first voltage and the voltage detection circuit detects that the voltage of the data line is lower than the first voltage, the voltage switch once switches the connection of the voltage line and connects the voltage line to the ground line, and thereafter switches the connection of the voltage line and reconnects the voltage line to the voltage source.

In the foregoing case, since the voltage switch once switches the connection of the voltage line to the ground line and thereafter switches the connection of the voltage line to the voltage source when the output voltage of the regulator is the first voltage and the voltage of the data line is lower than the first voltage, the voltage of the voltage line is reliably set to 0 V when the information processing apparatus performs processing for cycling the power and the drive voltage of the nonvolatile storage device is as the first voltage upon cycling the power and, therefore, the recovery processing of resolving the mismatch of the interface voltages between the information processing apparatus and the nonvolatile storage device can be performed. Since it is thereby possible to match the interface voltages between the information processing apparatus and the nonvolatile storage device, the information processing apparatus and the nonvolatile storage device can operate normally.

Preferably, the information processing apparatus reads data stored in the nonvolatile storage device in a nonvolatile manner after the control unit confirms that the voltage of the data line and the output voltage of the regulator are the same.

In the foregoing case, since the data stored in the nonvolatile storage device in a nonvolatile manner can be read after confirming that the voltage of the data line and the output voltage of the regulator are the same, normal reading operations can be performed in a state of avoiding a mismatch of the interface voltages between the information processing apparatus and the nonvolatile storage device.

Preferably, the input/output driver recognizes a high level of the second voltage to be a high level when the first voltage is being supplied as the drive voltage.

In the foregoing case, since the input/output driver can recognize the high level of the second voltage as a high level when the first voltage is the voltage source, even if there is a mismatch of the interface voltages between the information processing apparatus and the nonvolatile storage device, it is possible to correctly recognize the high level and the low level logically, and avoid abnormal operations of the circuit that occur directly.

The information processing system according to the present invention comprises any one of the foregoing information processing apparatuses and a nonvolatile storage device capable of reading and writing data from the information processing apparatus.

The nonvolatile storage device according to the present invention is a nonvolatile storage device connected to an information processing apparatus via a voltage line for supplying a power source from the information processing apparatus, a clock line for supplying a clock signal from the information processing apparatus, and one or more communication lines capable of bidirectionally communicating signals with the information processing apparatus, comprising a nonvolatile memory capable of storing data in a nonvolatile manner, a card regulator which is connected to the voltage line and which outputs a first voltage supplied from the information processing apparatus or a second voltage that is lower than the first voltage, a card input/output driver for driving the communication line with the output of the card regulator as a power source, a card voltage detection circuit for detecting whether a voltage of the communication line is the second voltage, or a voltage that is higher than the second voltage, and a card control unit for detecting whether a drive voltage of the information processing apparatus and a drive voltage of the nonvolatile storage device are different based on an output voltage of the card regulator and a detection result of the card voltage detection circuit.

In this nonvolatile storage device, since whether the voltage of the communication line is the second voltage or a voltage that is higher than the second voltage is detected, and whether the drive voltage of the information processing apparatus and the drive voltage of the nonvolatile storage are different is detected based on the foregoing detection result and the output voltage of the card regulator in the nonvolatile storage device, it is possible to detect a mismatch of the interface voltages between the information processing apparatus and the nonvolatile storage device, and thereby avoid factors that cause system failures.

Preferably, the card voltage detection circuit detects whether the voltage of the communication line is lower than the first voltage when the output voltage of the card regulator is the first voltage.

In the foregoing case, since whether the voltage of the communication line is lower than the first voltage is detected when the output voltage of the card regulator is the first voltage, the nonvolatile storage device can detect that the drive voltage of the information processing apparatus is lower than the drive voltage of the nonvolatile storage device.

Preferably, when the output voltage of the card regulator is the first voltage and the card voltage detection circuit detects that the voltage of the communication line is lower than the first voltage, the card control unit switches the output of the card regulator from the first voltage to the second voltage.

In the foregoing case, since the output of the card regulator is switched from the first voltage to the second voltage when the output voltage of the card regulator is the first voltage and the voltage of the communication line is lower than the first voltage, it is possible to perform recovery processing of resolving the mismatch of the interface voltages between the information processing apparatus and the nonvolatile storage device by lowering the drive voltage of the nonvolatile storage device so as to be identical to the drive voltage of the information processing apparatus. Since it is thereby possible to match the interface voltages between the information processing apparatus and the nonvolatile storage device, the information processing apparatus and the nonvolatile storage device can operate normally.

Preferably, when the output voltage of the card regulator is the first voltage and the card voltage detection circuit detects that the voltage of the communication line is lower than the first voltage, the card control unit prohibits the reading and writing of data from the information processing apparatus to the nonvolatile storage device.

In the foregoing case, since the reading and writing of data from the information processing apparatus to the nonvolatile storage device is prohibited when the output voltage of the card regulator is the first voltage and the voltage of the communication line is lower than the first voltage, it is possible to avoid failures of the information processing system caused by a mismatch of the interface voltages, and additionally notify the information processing apparatus that a mismatch of the interface voltages has occurred.

Preferably, the card voltage detection circuit detects whether the voltage of the communication line is higher than the second voltage when the output voltage of the card regulator is the second voltage.

In the foregoing case, since whether the voltage of the communication line is higher than the second voltage is detected when the output voltage of the card regulator is the second voltage, the nonvolatile storage device can detect that the drive voltage of the information processing apparatus is higher than the drive voltage of the nonvolatile storage device.

Preferably, when the output voltage of the card regulator is the second voltage and the card voltage detection circuit detects that the voltage of the communication line is higher than the second voltage, the card control unit switches the output of the card regulator from the second voltage to the first voltage.

In the foregoing case, since the output of the card regulator is switched from the second voltage to the first voltage when the output voltage of the card regulator is the second voltage and the voltage of the communication line is higher than the second voltage, it is possible to perform recovery processing of resolving the mismatch of the interface voltages between the information processing apparatus and the nonvolatile storage device by raising the drive voltage of the nonvolatile storage device so as to be identical to the drive voltage of the information processing apparatus. Since it is thereby possible to match the interface voltages between the information processing apparatus and the nonvolatile storage device, the information processing apparatus and the nonvolatile storage device can operate normally.

Preferably, when the output voltage of the card regulator is the second voltage and the card voltage detection circuit detects that the voltage of the communication line is higher than the second voltage, the card control unit prohibits the reading and writing of data from the information processing apparatus to the nonvolatile storage device.

In the foregoing case, since the reading and writing of data from the information processing apparatus to the nonvolatile storage device is prohibited when the output voltage of the card regulator is the second voltage and the voltage of the communication line is higher than the second voltage, it is possible to avoid failures of the information processing system caused by a mismatch of the interface voltages, and additionally notify the information processing apparatus that a mismatch of the interface voltages has occurred.

The nonvolatile memory controller according to the present invention is a nonvolatile memory controller that is used in any one of the foregoing nonvolatile storage devices, and comprises the card regulator, the card input/output driver, the card voltage detection circuit, and the card control unit.

The information processing system according to the present invention comprises any one of the foregoing nonvolatile storage devices, and an information processing apparatus for supplying voltage to the nonvolatile memory and performing reading and/or writing of data.

The nonvolatile storage device according to another aspect of the present invention is a nonvolatile storage device connected to an information processing apparatus via a voltage line for supplying a power source from the information processing apparatus, a clock line for supplying a clock signal from the information processing apparatus, and one or more communication lines capable of bidirectionally communicating signals with the information processing apparatus, comprising a nonvolatile memory capable of storing data in a nonvolatile manner, a card regulator which is connected to the voltage line and which outputs a first voltage supplied from the information processing apparatus or a second voltage that is lower than the first voltage, and a card input/output driver for driving the communication line with the output of the card regulator as a power source, wherein, in response to a command from the information processing apparatus for acquiring information concerning an output voltage of the card regulator, the nonvolatile storage device returns information concerning the output voltage of the card regulator to the information processing apparatus.

In this nonvolatile storage device, since information concerning the output voltage of the card regulator is returned to the information processing apparatus in response to a command from the information processing apparatus for acquiring information concerning the output voltage of the card regulator, the information processing apparatus can detect whether its drive voltage and the drive voltage of the nonvolatile storage device are different. Consequently, it is possible to detect a mismatch of the interface voltages between the information processing apparatus and the nonvolatile storage device, and thereby avoid factors that cause system failures.

The information processing apparatus according to another aspect of the present invention is an information processing apparatus connected to a nonvolatile storage device via a voltage line for supplying a power source to the nonvolatile storage device, a clock line for supplying a clock signal to the nonvolatile storage device, and one or more data lines at least one of which is pulled up by the nonvolatile storage device and which are used for bidirectionally communicating data signals with the nonvolatile storage device, comprising a voltage switch, a voltage source which is connected to the voltage line via the voltage switch and which supplies a predetermined first voltage to the voltage line, a regulator which is connected to the voltage line and which outputs the first voltage or a second voltage that is lower than the first voltage when the first voltage is applied, and an input/output driver for driving the clock line and the data line with the output of the regulator as a power source, wherein the information processing apparatus issues a command to the nonvolatile storage device for acquiring information of voltage required for the nonvolatile storage device to drive the data line, acquires information returned from the nonvolatile storage device concerning the voltage required for the nonvolatile storage device to drive the data line, compares the voltage required for the nonvolatile storage device to drive the data line and the output voltage of the regulator, and, if the two voltages are different, executes recovery processing of causing the output voltage of the regulator and the voltage required for the nonvolatile storage device to drive the data line to be the same.

In this information processing apparatus, since the information processing apparatus issues a command to the nonvolatile storage device for acquiring information of voltage required for the nonvolatile storage device to drive the data line, acquires information returned from the nonvolatile storage device concerning the voltage required for the nonvolatile storage device to drive the data line, compares the voltage required for the nonvolatile storage device to drive the data line and the output voltage of the regulator, and, if the two voltages are different, executes recovery processing of causing the output voltage of the regulator and the voltage required for the nonvolatile storage device to drive the data line to be the same, it is possible to detect a mismatch of the interface voltages between the information processing apparatus and the nonvolatile storage device and avoid factors that cause system failures, as well as match the interface voltages between the information processing apparatus and the nonvolatile storage device, and the information processing apparatus and the nonvolatile storage device can operate normally.

Preferably, the recovery processing includes processing of causing the voltage required for the nonvolatile storage device to drive the data line to be identical to the output voltage of the regulator.

In the foregoing case, since the voltage required for the nonvolatile storage device to drive the data line is caused to be identical to the output voltage of the regulator, it is possible to match the interface voltages between the information processing apparatus and the nonvolatile storage device, and the information processing apparatus and the nonvolatile storage device can operate normally.

Preferably, the recovery processing includes processing of causing the output voltage of the regulator to be identical to the voltage required for the nonvolatile storage device to drive the data line.

In the foregoing case, since the output voltage of the regulator is caused to be identical to the voltage required for the nonvolatile storage device to drive the data line, it is possible to match the interface voltages between the information processing apparatus and the nonvolatile storage device, and the information processing apparatus and the nonvolatile storage device can operate normally.

The information processing system according to another aspect of the present invention comprises the foregoing nonvolatile storage device and any one of the foregoing information processing apparatuses.

Since the present invention can avoid the occurrence of a failure such as a mismatch of the interface voltages in an information processing system configured from an information processing apparatus and a nonvolatile storage device and in which uses, as its interface voltage, a voltage that is different from the voltage that is supplied from the information processing apparatus to the nonvolatile storage device, the present invention is useful in an information processing system with superior user-friendliness.

This application is based on Japanese patent application serial no. 2010-059051, filed in Japan Patent Office on Mar. 16, 2010, the contents of which are hereby incorporated by reference.

Although the present invention has been fully described by way of example with reference to the accompanying drawings, it is to be understood that various changes and modifications will be apparent to those skilled in the art. Therefore, unless otherwise such changes and modifications depart from the scope of the present invention hereinafter defined, they should be construed as being included therein.

What is claimed is:

1. A nonvolatile storage device connected to an information processing apparatus via a voltage line for supplying a power source from the information processing apparatus, a clock line for supplying a clock signal from the information processing apparatus, and one or more communication lines capable of bidirectionally communicating signals with the information processing apparatus, comprising:

a nonvolatile memory capable of storing data in a nonvolatile manner;

a card regulator which is connected to the voltage line and which outputs a first voltage supplied from the information processing apparatus or a second voltage that is lower than the first voltage;

a card input/output driver which is connected to the card regulator and the communication line, and which drives the communication line with the output of the card regulator as a power source;

a card voltage detection circuit which is connected to the communication line in the nonvolatile storage device and which detects that a voltage of the communication line is the second voltage and detects that the voltage of the communication line is a voltage that is lower than the first voltage and is higher than the second voltage; and a card control unit for detecting whether a drive voltage of the information processing apparatus and a drive voltage of the nonvolatile storage device are different based on an output voltage of the card regulator and a detection result of the card voltage detection circuit.

2. The nonvolatile storage device according to claim 1, wherein the card voltage detection circuit detects whether the voltage of the communication line is lower than the first voltage when the output voltage of the card regulator is the first voltage.

3. The nonvolatile storage device according to claim 2, wherein, when the output voltage of the card regulator is the first voltage and the card voltage detection circuit detects that the voltage of the communication line is lower than the first voltage, the card control unit switches the output of the card regulator from the first voltage to the second voltage.

4. The nonvolatile storage device according to claim 2, wherein, when the output voltage of the card regulator is the first voltage and the card voltage detection circuit detects that the voltage of the communication line is lower than the first voltage, the card control unit prohibits the reading and writing of data from the information processing apparatus to the nonvolatile storage device.

5. The nonvolatile storage device according to claim 1, wherein the card voltage detection circuit detects whether the voltage of the communication line is higher than the second voltage when the output voltage of the card regulator is the second voltage.

6. The nonvolatile storage device according to claim 5, wherein, when the output voltage of the card regulator is the second voltage and the card voltage detection circuit detects that the voltage of the communication line is higher than the second voltage, the card control unit switches the output of the card regulator from the second voltage to the first voltage.

7. The nonvolatile storage device according to claim 5, wherein, when the output voltage of the card regulator is the second voltage and the card voltage detection circuit detects that the voltage of the communication line is higher than the second voltage, the card control unit prohibits the reading and writing of data from the information processing apparatus to the nonvolatile storage device.

8. A nonvolatile memory controller for use in the nonvolatile storage device according to claim 1, comprising:
the card regulator;
the card input/output driver;
the card voltage detection circuit; and
the card control unit.

9. An information processing system, comprising:
the nonvolatile storage device according to claim 1; and
an information processing apparatus for supplying voltage to the nonvolatile memory and performing reading and/or writing of data.

* * * * *